United States Patent
Cho et al.

(10) Patent No.: US 10,453,913 B2
(45) Date of Patent: Oct. 22, 2019

(54) CAPACITOR, SEMICONDUCTOR DEVICE AND METHODS OF MANUFACTURING THE CAPACITOR AND THE SEMICONDUCTOR DEVICE

(71) Applicant: Samsung Electronics Co., Ltd., Suwon-si (KR)

(72) Inventors: Kyuho Cho, Seoul (KR); Sangyeol Kang, Yongin-si (KR); Suhwan Kim, Seoul (KR); Sunmin Moon, Yongin-si (KR); Young-Lim Park, Anyang-si (KR); Jong-Bom Seo, Seoul (KR); Joohyun Jeon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/938,234

(22) Filed: Mar. 28, 2018

(65) Prior Publication Data
US 2018/0315811 A1   Nov. 1, 2018

(51) Int. Cl.
*H01L 49/02*   (2006.01)
*H01L 21/02*   (2006.01)

(52) U.S. Cl.
CPC .......... *H01L 28/75* (2013.01); *H01L 21/0228* (2013.01); *H01L 21/02181* (2013.01); *H01L 21/02189* (2013.01); *H01L 21/02271* (2013.01); *H01L 21/02304* (2013.01); *H01L 21/02356* (2013.01); *H01L 21/02362* (2013.01); *H01L 28/91* (2013.01); *H01L 21/02244* (2013.01)

(58) Field of Classification Search
CPC ... H01L 28/75; H01L 28/91; H01L 21/02189; H01L 21/02181; H01L 21/0228; H01L 21/02356; H01L 21/02244
USPC ....... 257/295, 296, 300, 532, 534, 535, 770, 257/771, E21.303, E21.648, E21.649, 257/E27.048, E29.001; 361/305, 540; 438/253, 386, 396, 633, 785, 957
See application file for complete search history.

(56) References Cited

U.S. PATENT DOCUMENTS

| | | | |
|---|---|---|---|
| 7,217,630 B2 | 5/2007 | Basceri et al. | |
| 7,772,132 B2 * | 8/2010 | Kil ........................ | C23C 16/405 438/785 |
| 8,247,317 B2 | 8/2012 | Moffatt et al. | |
| 8,541,868 B2 | 9/2013 | Malhotra et al. | |
| 8,765,570 B2 | 7/2014 | Malhotra et al. | |
| 8,860,115 B2 | 10/2014 | Jun | |
| 8,896,097 B2 | 11/2014 | Wamura et al. | |
| 8,956,689 B2 | 2/2015 | Watanabe et al. | |

(Continued)

FOREIGN PATENT DOCUMENTS

KR  10-2006-0037970 A   5/2006
KR  10-2009-0114994 A   11/2009

(Continued)

*Primary Examiner* — Dao H Nguyen
(74) *Attorney, Agent, or Firm* — Muir Patent Law, PLLC

(57) ABSTRACT

A capacitor includes a first electrode and a second electrode spaced apart from each other, a dielectric layer disposed between the first electrode and the second electrode, and a seed layer disposed between the first electrode and the dielectric layer. The dielectric layer includes a dielectric material having a tetragonal crystal structure. The seed layer includes a seed material that satisfies at least one of a lattice constant condition or a bond length condition.

21 Claims, 26 Drawing Sheets

(56) References Cited

U.S. PATENT DOCUMENTS

| | | |
|---|---|---|
| 9,281,357 B2 | 3/2016 | Chen et al. |
| 2008/0123243 A1 | 5/2008 | Hamada et al. |
| 2008/0128856 A1* | 6/2008 | Kwak ................ H01L 23/5223 257/532 |
| 2009/0273882 A1 | 11/2009 | Park et al. |
| 2012/0088360 A1* | 4/2012 | Kim ................ H01L 21/28273 438/592 |
| 2013/0001746 A1* | 1/2013 | Edwards ................ H01L 28/82 257/534 |
| 2013/0093288 A1* | 4/2013 | Fox ........................ C30B 23/02 310/348 |
| 2014/0144681 A1* | 5/2014 | Pushparaj ............ C03C 17/3435 174/257 |
| 2014/0231958 A1 | 8/2014 | Lim et al. |
| 2014/0327062 A1 | 11/2014 | Park et al. |
| 2015/0031186 A1* | 1/2015 | Kim ................ H01L 21/02189 438/396 |

FOREIGN PATENT DOCUMENTS

| | | |
|---|---|---|
| KR | 10-0971415 B1 | 7/2010 |
| KR | 10-2014-0131142 A | 11/2014 |

* cited by examiner

CAPACITOR, SEMICONDUCTOR DEVICE AND METHODS OF MANUFACTURING THE CAPACITOR AND THE SEMICONDUCTOR DEVICE

CROSS-REFERENCE TO RELATED APPLICATION

This U.S. non-provisional patent application claims priority under 35 U.S.C. § 119 to Korean Patent Application Nos. 10-2017-0053872 and 10-2017-0118877, respectively filed on Apr. 26, 2017 and Sep. 15, 2017, in the Korean Intellectual Property Office, the disclosure of which is hereby incorporated by reference in its entirety.

BACKGROUND

Embodiments of the inventive concepts relate to a capacitor, a semiconductor device and methods of manufacturing the capacitor and the semiconductor device. For example, the disclosure relates to a capacitor including a high-k dielectric layer and a method of manufacturing the same. For example, the disclosure relates a semiconductor device including a high-k dielectric layer and a method of manufacturing the semiconductor device.

Capacitors having sufficient capacitances in limited areas have been demanded as semiconductor devices have been highly integrated. A capacitance of a capacitor may be in proportion to a surface area of an electrode composing the capacitor and a dielectric constant of a dielectric layer disposed between two electrodes composing the capacitor and may be in inversely proportional to an equivalent oxide thickness (EOT) of the dielectric layer. Thus, to increase a capacitance of a capacitor in a limited area, a capacitor having a three-dimensional structure may be formed to increase a surface area of an electrode, an equivalent oxide thickness of a dielectric layer may be reduced, and/or a material having a high dielectric constant may be used as the dielectric layer.

SUMMARY

Embodiments of the inventive concepts may provide a capacitor with improved capacitance.

Embodiments of the inventive concepts may also provide a method of manufacturing a capacitor with improved capacitance, which is capable of simplifying manufacturing processes.

Embodiments of the inventive concepts may further include a semiconductor device with improved reliability.

In one aspect, a capacitor may include a first electrode and a second electrode spaced apart from each other, a dielectric layer disposed between the first electrode and the second electrode, and a first seed layer disposed between the first electrode and the dielectric layer. The dielectric layer may include a dielectric material having a tetragonal crystal structure. The first seed layer may include a first seed material. A lattice constant of the first seed material may have a lattice mismatch of 2% or less with a horizontal lattice constant of the dielectric material.

In one aspect, a capacitor may include a first electrode and a second electrode spaced apart from each other, a dielectric layer disposed between the first electrode and the second electrode, and a metal seed layer disposed between the first electrode and the dielectric layer. The dielectric layer may include a dielectric material having a tetragonal crystal structure. The metal seed layer may include a seed material. A mismatch between a bond length between metal atoms of the seed material and a bond length between oxygen atoms of the dielectric material may be 5% or less.

In one aspect, a capacitor may include a first electrode and a second electrode spaced apart from each other, a dielectric layer disposed between the first electrode and the second electrode, and a seed layer disposed between the first electrode and the dielectric layer. The dielectric layer may include hafnium oxide having a tetragonal crystal structure or zirconium oxide having a tetragonal crystal structure. The seed layer may include a cobalt layer, a nickel layer, a copper layer, or a $CO_xN$ layer (where $3.5<x<4.5$).

In one aspect, a method of manufacturing a capacitor may include sequentially forming a first electrode, a dielectric layer, and a second electrode on a substrate, and forming a seed layer between the first electrode and the dielectric layer or between the dielectric layer and the second electrode. The dielectric layer may include hafnium oxide or zirconium oxide. The seed layer may include a seed material. A lattice constant of the seed material may have a lattice mismatch of 2% or less with a horizontal lattice constant of a tetragonal crystal structure of an oxide included in the dielectric layer.

In one aspect, a method of manufacturing a capacitor may include sequentially forming a first electrode, a dielectric layer, and a second electrode on a substrate, and forming a metal seed layer between the first electrode and the dielectric layer or between the dielectric layer and the second electrode. The dielectric layer may include hafnium oxide or zirconium oxide. The metal seed layer may include a seed material. A mismatch between a bond length between metal atoms of the seed material and a bond length between oxygen atoms of a tetragonal crystal structure of an oxide included in the dielectric layer may be 5% or less.

In some embodiments, a method of manufacturing a semiconductor device includes forming a dielectric layer, a first metal layer and a first electrode on a substrate, wherein the first metal layer is interposed between the dielectric layer and the first electrode, wherein the first metal layer includes a first metal having a cubic crystal structure, wherein the dielectric layer includes a material having a tetragonal crystal structure.

BRIEF DESCRIPTION OF THE DRAWINGS

The inventive concepts will become more apparent in view of the attached drawings and accompanying detailed description.

DETAILED DESCRIPTION

Figure 1:
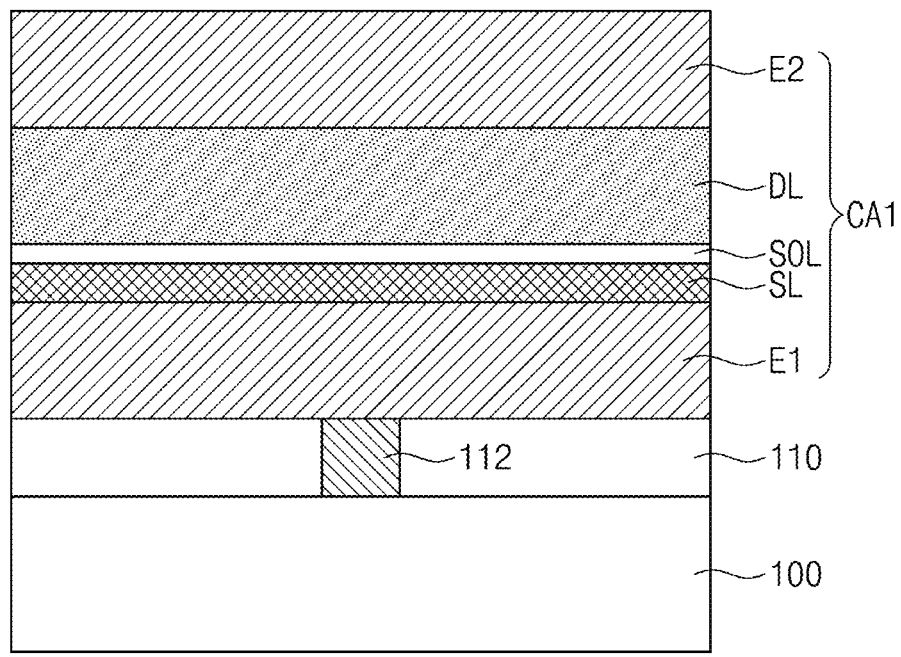
FIG. 1 is a cross-sectional view illustrating a capacitor according to some embodiments of the inventive concepts.

Hereinafter, embodiments of the inventive concepts will be described in detail with reference to the accompanying drawings. The same reference numerals or the same reference designators may denote the same elements throughout the disclosure.

Figure 2A:
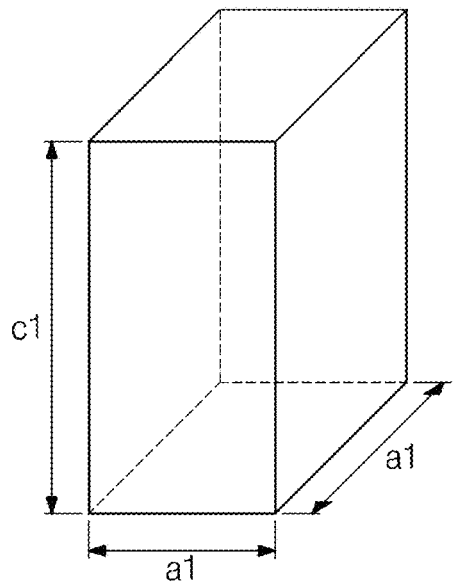
FIG. 2A illustrates a tetragonal crystal structure of a dielectric material according to some embodiments of the inventive concepts.
Figure 2B:
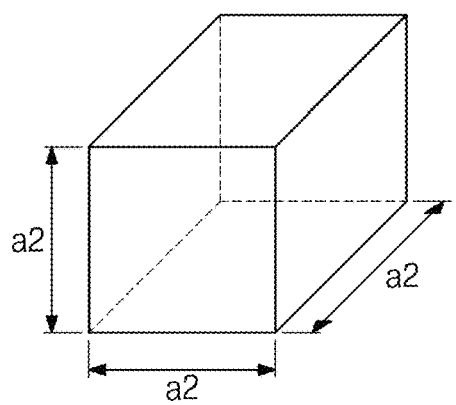
FIG. 2B illustrates a cubic crystal structure of a seed material according to some embodiments of the inventive concepts.

FIG. 1 is a cross-sectional view illustrating a capacitor according to some embodiments of the inventive concepts. FIG. 2A illustrates a tetragonal crystal structure of a dielectric material according to some embodiments of the inventive concepts. FIG. 2B illustrates a cubic crystal structure of a seed material according to some embodiments of the inventive concepts.

Referring to FIG. 1, a substrate 100 may be provided. The substrate 100 may be a semiconductor substrate. For example, the substrate 100 may be a silicon substrate, a germanium substrate, or a silicon-germanium substrate.

A selection element (not shown) may be provided on the substrate 100. In some embodiments, the selection element may be a transistor. In these embodiments, some components (e.g., a source region and a drain region) of the transistor may be provided in the substrate 100.

An interlayer insulating layer 110 may be provided on the substrate 100. The interlayer insulating layer 110 may cover the selection element. For example, the interlayer insulating layer 110 may include at least one of silicon oxide, silicon nitride, or silicon oxynitride.

A contact plug 112 may be provided in the interlayer insulating layer 110. The contact plug 112 may be electrically connected to the selection element. The contact plug 112 may include a conductive material. For example, the contact plug 112 may include at least one of a semiconductor doped with dopants or a dopant (e.g., doped silicon, doped germanium, or doped silicon-germanium), a metal (e.g., titanium, tantalum, or tungsten), a conductive metal nitride (e.g., titanium nitride or tantalum nitride), and/or a metal-semiconductor compound (e.g., a metal silicide).

A capacitor CA1 may be provided on the interlayer insulating layer 110. The capacitor CA1 may include a first electrode E1, a second electrode E2, a dielectric layer DL, and a seed layer SL.

The first electrode E1 may be disposed on the interlayer insulating layer 110. The first electrode E1 may be electrically connected to the selection element through the contact plug 112. The first electrode E1 may include a conductive material. For example, the first electrode E1 may include at least one of a semiconductor doped with dopants or a dopant (e.g., an impurity), a metal, a conductive metal nitride, and/or a metal-semiconductor compound. For example, the dopant of the semiconductor may be one or more of boron, phosphorous, arsenic, antimony, gallium, aluminum, etc.

The second electrode E2 may be spaced apart from the first electrode E1. For example, the second electrode E2 may be vertically spaced apart from the first electrode E1, as illustrated in FIG. 1. However, embodiments of the inventive concepts are not limited thereto. The second electrode E2 may include a conductive material. For example, the second electrode E2 may include at least one of a semiconductor doped with dopants or a dopant, a metal, a conductive metal nitride, and/or a metal-semiconductor compound.

The dielectric layer DL may be disposed between the first electrode E1 and the second electrode E2. The dielectric layer DL may include a dielectric material having a tetragonal crystal structure like FIG. 2A. For example, the dielectric layer DL may include hafnium oxide (i.e., $HfO_2$) having the tetragonal crystal structure or zirconium oxide (i.e., $ZrO_2$) having the tetragonal crystal structure. Two of lattice constants of the dielectric material having the tetragonal crystal structure may be equal to each other. For example, a tetragonal crystal structure of the dielectric layer DL may have three lattice constants, and two of the three lattice constants may be equal and one other lattice constant may be different from the two equal lattice constants. For example, the tetragonal crystal structures of the dielectric layer DL may be simple/primitive tetragonal crystal structures. In the present disclosure, the two same lattice constants a1 of the dielectric material having the tetragonal crystal structure are defined as horizontal lattice constants, and the other lattice constant c1 of the dielectric material is defined as a vertical lattice constant.

The hafnium oxide having the tetragonal crystal structure may have a higher dielectric constant than hafnium oxide having a monoclinic crystal structure. For example, the dielectric constant of the hafnium oxide having the tetragonal crystal structure may range from about 40 to about 60, and the dielectric constant of the hafnium oxide having the monoclinic crystal structure may be about 20. Likewise, the zirconium oxide having the tetragonal crystal structure may have a higher dielectric constant than zirconium oxide having a monoclinic crystal structure. For example, the dielectric constant of the zirconium oxide having the tetragonal crystal structure may be about 40, and the dielectric constant of the zirconium oxide having the monoclinic crystal structure may be about 20.

Some characteristics of the hafnium oxide ($t$-$HfO_2$) having the tetragonal crystal structure and the zirconium oxide ($t$-$ZrO_2$) having the tetragonal crystal structure according to some embodiments are shown in the following table 1.

TABLE 1

|  | $t$-$HfO_2$ | $m$-$HfO_2$ | $t$-$ZrO_2$ | $m$-$ZrO_2$ |
|---|---|---|---|---|
| Crystal Structure | simple tetragonal | simple monoclinic | simple tetragonal | simple monoclinic |
| Lattice Constant (Å) | a1 = 3.58 c1 = 5.20 | a1 = 5.13 b1 = 5.19 c1 = 5.30 | a1 = 3.60 c1 = 5.17 | a1 = 5.15 b1 = 5.20 c1 = 5.32 |
| Bond Length (Å) between oxygen atoms | 2.60 | 2.81 | 2.62 | 2.95 |

The seed layer SL may be disposed between the first electrode E1 and the dielectric layer DL. The thickness of the seed layer SL may range from about 5 Å to about 100 Å.

The seed layer SL may include a seed material that assists the crystallization of the dielectric material in the tetragonal crystal structure. The seed material may satisfy at least one of the following lattice constant condition or the following bond length condition.

[Lattice Constant Condition]

The lattice constant of the seed material may have a lattice mismatch of about 2% or less (e.g., at room temperature) with the horizontal lattice constant of the dielectric material. The seed material may have a cubic crystal structure like FIG. 2B, and thus lattice constants a2 of the seed material may be equal to each other. For example, the seed material may have a face-centered cubic crystal structure. In certain embodiments, the seed material may have a simple cubic crystal structure or a body-centered cubic crystal structure. In the present disclosure, the lattice mismatch between the lattice constant of the seed material and the horizontal lattice constant of the dielectric material (i.e., the lattice mismatch of the lattice constant of the seed material with the horizontal lattice constant of the dielectric material) is defined by the following equation 1.

$$LS = \frac{|a1 - a2|}{a1} \quad \text{[Equation 1]}$$

In the equation 1, "LS" is the lattice mismatch, "a1" is the horizontal lattice constant of the dielectric material having tetragonal crystal structure, and "a2" is the lattice constant of the seed material. For example, a1 may be the two equal lattice constants of the tetragonal crystal structure of the dielectric material.

When the lattice constant condition is satisfied (e.g., a lattice mismatch of 2% or less), the lattice mismatch between the lattice constant of the seed material and the horizontal lattice constant of the dielectric material having the tetragonal crystal structure may be smaller than a lattice mismatch between the lattice constant of the seed material and a lattice constant a1, b1 or c1 of the dielectric material having the monoclinic crystal structure. For example, when the lattice constant condition is satisfied, a lattice mismatch between the lattice constant of the seed material having a cubic crystal structure and the horizontal lattice constant of a tetragonal crystal structure of the dielectric material may be smaller than a lattice mismatch between the lattice constant of the seed material and each (or an average) of the lattice constants (or horizontal lattice constants) of a monoclinic crystal structure of the dielectric material.

[Bond Length Condition]

The seed material may be a metal. A mismatch between a bond length between metal atoms included in the seed material and a bond length between oxygen atoms included in the dielectric material having the tetragonal crystal structure may be about 5% or less (e.g., at room temperature). In the present disclosure, the mismatch between the bond length between the metal atoms included in the seed material and the bond length between the oxygen atoms included in the dielectric material having the tetragonal crystal structure is defined by the following equation 2.

$$BM = \frac{|BL1 - BL2|}{BL1} \quad \text{[Equation 2]}$$

In the equation 2, "BM" is the mismatch between the bond lengths, "BL1" is the bond length between the oxygen atoms included in the dielectric material having the tetragonal crystal structure, and "BL2" is the bond length between the metal atoms included in the seed material.

When the bond length condition is satisfied (e.g., bond length mismatch of 5% or less), the mismatch between the bond length between the metal atoms included in the seed material and the bond length between the oxygen atoms included in the dielectric material having the tetragonal crystal structure may be smaller than a mismatch between the bond length between the metal atoms included in the seed material and a bond length between oxygen atoms included in the dielectric material having the monoclinic crystal structure.

When the bond length condition is satisfied, the metal atoms included in the seed material may interact with the oxygen atoms included in the dielectric material, respectively. At this time, the metal atoms of the seed material may be metal atoms exposed at a top surface of the seed layer SL. For example, when the bond length condition is satisfied, metal atoms of the seed layer SL may affect arrangements of oxygen atoms of the dielectric layer at the boundary between the seed layer SL and the dielectric layer DL (e.g., by an electrical force and/or by a combination of atoms). For example, the seed material may crystallize the dielectric material into the tetragonal crystal structure under a predetermined temperature condition (e.g., a temperature of 240 degrees Celsius or more).

According to some embodiments, the seed material may satisfy the following conductive condition, the following work function condition, and/or the following oxide band gap condition.

[Conductive Condition]

The seed material may have conductivity. For example, the seed material included in the seed layer may be a conductor.

[Oxide Band Gap Condition]

A band gap (e.g., an energy band gap) of an oxide of the seed material may be about 3 eV or less.

[Work Function Condition]

A work function of the seed material may be about 4.7 eV or more.

When the seed material satisfies the conductivity condition, the seed layer SL may function as an electrode in the capacitor CAL which may be beneficial to reducing or inhibiting an increase in equivalent oxide thickness of the capacitor CA1. For example, in certain embodiments, the seed material may be a conductor, and the seed layer SL works as an electrode of the capacitor CA1. Therefore, the capacitor CA1 may have a thin insulation layer, which is beneficial to have a greater capacitance of the capacitor CA1. For example, the seed layer SL and an electrode E1 or E2 contacting the seed layer SL may collectively function as an electrode of the capacitor CA1. For example, in certain embodiments, an electrode may include a doped semiconductor layer and a metal layer contacting each other.

In some embodiments, the capacitor CA1 may include a sub-oxide layer SOL disposed between the seed layer SL and the dielectric layer DL, as illustrated in FIG. 1. The thickness of the sub-oxide layer SOL may range from about 5 Å to about 10 Å. A portion of the seed layer SL may be oxidized to form the sub-oxide layer SOL. For example, the sub-oxide layer SOL may include the same metal as the metal included in the seed layer SL. When the seed material satisfies the oxide band gap condition, the sub-oxide layer SOL may function as an electrode in the capacitor CAL which may be beneficial to reducing or inhibiting an increase in equivalent oxide thickness of the capacitor CA1.

In certain embodiments, the capacitor CA1 may not include the sub-oxide layer SOL, unlike FIG. 1.

When the seed material satisfies the work function condition, the seed layer SL may inhibit a leakage current from occurring in the capacitor CA1 or may reduce leakage current in the capacitor CA1.

In some embodiments, the seed layer SL may have a thickness of about 3 Å to about 50 Å. When the thickness of the seed layer SL is greater than 50 Å, it may be difficult to reduce a size of the capacitor CA1. When the thickness of the seed layer SL is less than 3 Å, it may be difficult to crystallize the dielectric layer DL into the tetragonal crystal structure. However, according to some embodiments of the inventive concepts, the seed layer SL may crystallize the dielectric layer DL into the tetragonal crystal structure, and thus the dielectric layer DL may have a high-k dielectric characteristic. For example, the size of the capacitor CA1 may be reduced or minimized according to some embodiments of the present disclosure.

The seed material may include cobalt, nickel, copper, or cobalt nitride. The cobalt nitride may be $Co_4N$ or may have a composition ratio similar to that of $Co_4N$. For example, the seed material may include $CO_xN$ where $3.5<x<4.5$. Each of cobalt, nickel, copper, and $Co_4N$ may satisfy at least one of the above conditions. Cobalt, nickel, copper, and $Co_4N$ may have characteristics shown in the following table 2.

TABLE 2

|  | Cobalt | Nickel | Copper | $Co_4N$ |
|---|---|---|---|---|
| Crystal Structure | cubic (FCC) | cubic (FCC) | cubic (FCC) | cubic (FCC) |
| Lattice Constant (Å) | a2 = 3.54 | a2 = 3.52 | a2 = 3.61 | a2 = 3.59 |
| Bond Length (Å) between metal atoms | 2.51 | 2.49 | 2.55 | — |
| Lattice Mismatch (%) with t-$HfO_2$ | 0.84 | 1.68 | 0.84 | 0.28 |
| Bond Length Mismatch (%) with t-$HfO_2$ | 3.46 | 4.23 | 1.92 | — |
| Lattice Mismatch (%) with m-$HfO_2$ (compared with a1 of m-$HfO_2$) | 30.99 | 31.38 | 29.43 | 30.02 |
| Bond Length Mismatch (%) with m-$HfO_2$ | 11.03 | 11.39 | 9.25 | — |
| Lattice Mismatch (%) with t-$ZrO_2$ | 1.39 | 2.22 | 0.28 | 0.28 |
| Bond Length Mismatch (%) with t-$ZrO_2$ | 4.20 | 4.96 | 2.67 | — |
| Lattice Mismatch (%) with m-$ZrO_2$ (compared with a1 of m-$ZrO_2$) | 31.26 | 31.65 | 29.71 | 30.29 |
| Bond Length Mismatch (%) with m-$ZrO_2$ | 15.25 | 15.59 | 13.56 | — |

Referring to the table 2, it may be recognized that each of cobalt, nickel, copper, and $Co_4N$ satisfies at least one of the lattice constant condition or the bond length condition with respect to the hafnium oxide (t-$HfO_2$) having the tetragonal crystal structure. For example, cobalt, nickel, copper, and $Co_4N$ satisfy the lattice constant condition with respect to the hafnium oxide (t-$HfO_2$) having the tetragonal crystal structure. Cobalt, nickel and copper satisfy the bond length condition with respect to the hafnium oxide (t-$HfO_2$) having the tetragonal crystal structure.

The lattice mismatch between the lattice constant of each of cobalt, nickel, copper, and $Co_4N$ and the horizontal lattice constant of the hafnium oxide (t-$HfO_2$) having the tetragonal crystal structure is smaller than the lattice mismatch between the lattice constant of each of cobalt, nickel, copper, and $Co_4N$ and the lattice constant of the hafnium oxide (m-$HfO_2$) having the monoclinic crystal structure. The mismatch between the bond length between the metal atoms of each of cobalt, nickel, and copper and the bond length between the oxygen atoms of the hafnium oxide (t-$HfO_2$) having the tetragonal crystal structure is smaller than the mismatch between the bond length between the metal atoms of each of the cobalt, nickel, and copper and the bond length between the oxygen atoms of the hafnium oxide (m-$HfO_2$) having the monoclinic crystal structure.

It may be recognized that each of cobalt, nickel, copper, and $Co_4N$ satisfies at least one of the lattice constant condition or the bond length condition with respect to the zirconium oxide (t-$ZrO_2$) having the tetragonal crystal structure. For example, copper and $Co_4N$ satisfy the lattice constant condition with respect to the zirconium oxide (t-$ZrO_2$) having the tetragonal crystal structure. Cobalt, nickel and copper satisfy the bond length condition with respect to the zirconium oxide (t-$ZrO_2$) having the tetragonal crystal structure.

The lattice mismatch between the lattice constant of each of cobalt, nickel, copper, and $Co_4N$ and the horizontal lattice constant of the zirconium oxide (t-$ZrO_2$) having the tetragonal crystal structure is smaller than the lattice mismatch between the lattice constant of each of cobalt, nickel, copper, and $Co_4N$ and the lattice constant of the zirconium oxide (m-$ZrO_2$) having the monoclinic crystal structure. The mismatch between the bond length between the metal atoms of each of cobalt, nickel, and copper and the bond length between the oxygen atoms of the zirconium oxide (t-$ZrO_2$) having the tetragonal crystal structure is smaller than the mismatch between the bond length between the metal atoms of each of the cobalt, nickel, and copper and the bond length between the oxygen atoms of the zirconium oxide (m-$ZrO_2$) having the monoclinic crystal structure.

Each of cobalt, nickel, copper, and $Co_4N$ may have conductivity and may have a work function of 4.7 eV or more. An oxide of each of cobalt, nickel, copper, and $Co_4N$ may have a band gap of 3 eV or less. For example, each of the cobalt, nickel, copper, and $Co_4N$ may satisfy the conductive condition, the oxide band gap condition, and the work function condition.

In the present disclosure, cobalt, nickel, copper, and $Co_4N$ are described as examples of the seed material. However, embodiments of the inventive concepts are not limited thereto. In certain embodiments, other material satisfying the above conditions may be used as the seed material.

Conductive interconnection lines (not shown) may be provided on the capacitor CA1. The conductive interconnection lines may be electrically connected to the second electrode E2. For example, the conductive interconnection lines may include at least one of a semiconductor doped with dopants or a dopant, a metal, a conductive metal nitride, and/or a metal-semiconductor compound.

According to some embodiments of the inventive concepts, the dielectric layer DL may include the hafnium oxide of the tetragonal crystal structure or the zirconium oxide of the tetragonal crystal structure, which has a high dielectric constant. Thus, a capacitance of the capacitor CA1 may be improved.

According to some embodiments of the inventive concepts, the seed layer SL and the sub-oxide layer SOL formed by the oxidation of a portion of the seed layer SL may function as an electrode, which may be beneficial to reducing or inhibiting an increase in equivalent oxide thickness of the capacitor CA1.

According to some embodiments of the inventive concepts, the seed layer SL may include the seed material of which the work function is about 4.7 eV or more. For example, the seed layer SL may inhibit a leakage current from occurring in the capacitor CA1 or may reduce leakage current in the capacitor CA1.

According to some embodiments of the inventive concepts, the dielectric layer DL may have a thickness of about 35 Å to about 85 Å. When the thickness of the dielectric layer DL is less than 35 Å, a leakage current may occur through the dielectric layer DL. When the thickness of the dielectric layer DL is greater than 85 Å, it may be difficult to reduce a size of the capacitor CA1.

Figure 3:
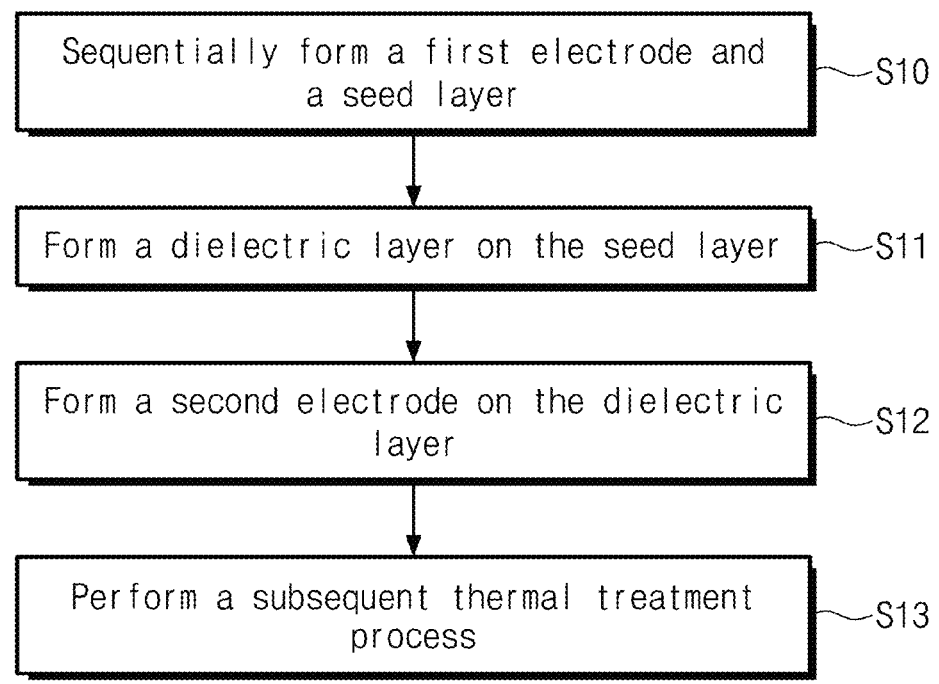
FIG. 3 is a flowchart illustrating a method of manufacturing a capacitor according to some embodiments of the inventive concepts.
Figure 4A:
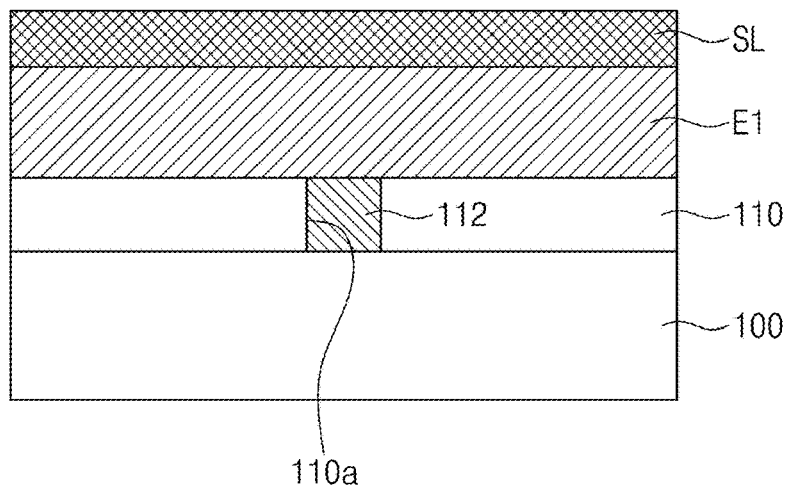
FIGS. 4A to 4C are cross-sectional views illustrating a method of manufacturing a capacitor according to some embodiments of the inventive concepts.
Figure 4B:
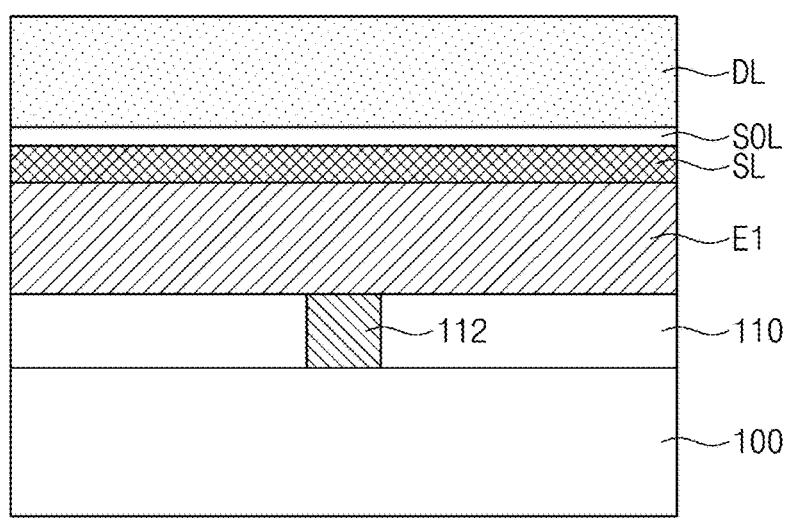
Figure 4C:
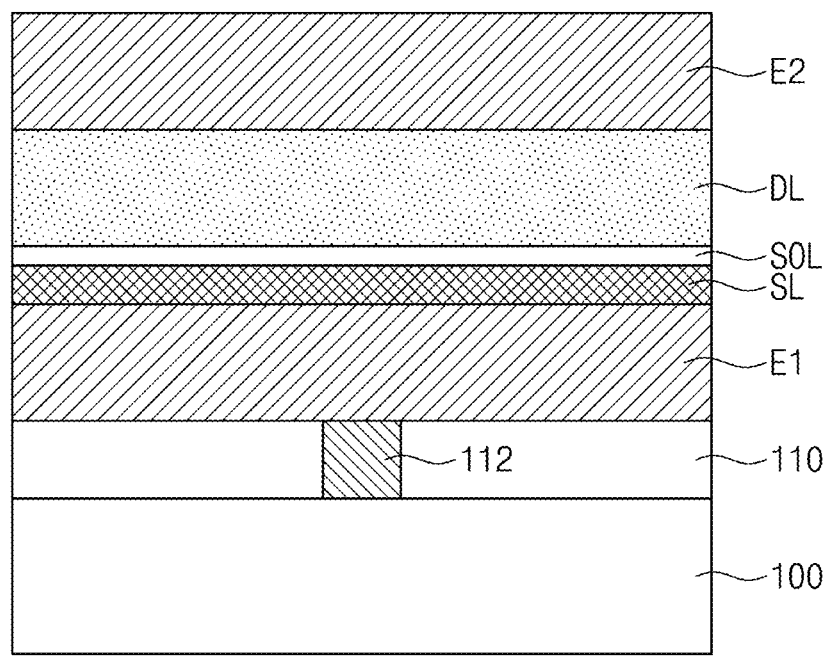

FIG. 3 is a flowchart illustrating a method of manufacturing a capacitor according to some embodiments of the inventive concepts. FIGS. 4A to 4C are cross-sectional views illustrating a method of manufacturing a capacitor according to some embodiments of the inventive concepts. For example, FIGS. 3 and 4A to 4C may be views illustrating a method of manufacturing the capacitor described with reference to FIG. 1. Hereinafter, the same elements or components as described with reference to FIG. 1 will be indicated by the same reference numerals or the same reference designators, and the descriptions thereto will be omitted or mentioned briefly for the purpose of ease and convenience in explanation.

Referring to FIGS. 3 and 4A, an interlayer insulating layer 110 may be formed on a substrate 100. The interlayer insulating layer 110 may cover a selection element (not shown) formed on the substrate 100. For example, the selection element may be a transistor as similarly described with respect to FIG. 1.

A contact plug 112 may be formed in the interlayer insulating layer 110. The contact plug 112 may be electrically connected to the selection element. The formation of the contact plug 112 may include forming a contact hole 110a in the interlayer insulating layer 110, forming a conductive layer (not shown) filling the contact hole 110a, and performing a planarization process on the conductive layer.

A first electrode E1 and a seed layer SL may be sequentially formed on the interlayer insulating layer 110 (S10).

The first electrode E1 may be formed on the interlayer insulating layer 110. The first electrode E1 may be electrically connected to the contact plug 112. For example, the first electrode E1 may be formed using a chemical vapor deposition (CVD) process or an atomic layer deposition (ALD) process.

The seed layer SL may be formed on the first electrode E1. For example, the seed layer SL may be formed using a CVD process or an ALD process.

The seed layer SL may include a seed material that assists the crystallization of a dielectric material, included in a dielectric layer DL to be formed in a subsequent process, in a tetragonal crystal structure. The seed material may be substantially the same as the one described above with reference to FIG. 1. For example, the seed material may satisfy at least one of the aforementioned lattice constant condition or the aforementioned bond length condition. For example, the seed material may satisfy the aforementioned conductive condition, the aforementioned work function condition, and/or the aforementioned oxide band gap condition. For example, the seed material may include cobalt, nickel, copper, or cobalt nitride. The cobalt nitride may be $Co_4N$ or may have a composition ratio similar to that of $Co_4N$. For example, the seed material may include $CO_xN$ where $3.5<x<4.5$. The seed layer SL may be formed to have a thickness of about 3 Å to about 50 Å.

Referring to FIGS. 3 and 4B, a dielectric layer DL may be formed on the seed layer SL (S11). For example, the dielectric layer DL may be formed by a CVD process or an ALD process. In some embodiments, immediately after the formation of the dielectric layer DL on the seed layer SL, the dielectric layer DL may include an amorphous dielectric material. For example, the dielectric layer DL may be at least partially amorphous dielectric layer when the dielectric layer is formed on the seed layer SL. For example, the dielectric layer DL may include amorphous hafnium oxide or amorphous zirconium oxide.

The amorphous dielectric material included in the dielectric layer DL may be affected by the seed layer SL, and thus the amorphous dielectric material may be crystallized in the tetragonal crystal structure at a relatively low temperature of, for example, about 240 degrees Celsius or more. For example, the amorphous dielectric material may be crystallized at a temperature of about 240 degrees Celsius to about 600 degrees Celsius. For example, the amorphous dielectric material may be crystallized at a temperature of about 240 degrees Celsius to about 400 degrees Celsius.

In certain embodiment, at least a portion of the dielectric layer DL may be crystallized in the tetragonal crystal structure during the deposition process. The dielectric layer DL may be formed or deposited at a temperature of about 240 degrees Celsius or more. For example, the dielectric layer DL may be formed or deposited at a temperature of about 240 degrees Celsius to about 290 degrees Celsius.

Under these temperature conditions, the seed layer SL may help or induce crystallization of the dielectric material into the tetragonal crystal structure. Immediately after formation of the dielectric layer DL, the dielectric layer DL may include the dielectric material having the tetragonal crystal structure and the amorphous dielectric material. For example, the dielectric layer DL may be formed to have a tetragonal crystal structure during the CVD process or the ALD process. For example, the seed layer SL may be helpful for the dielectric layer DL to have the tetragonal crystal structure during the CVD process or the ALD process, and/or immediately after the CVD process or the ALD process.

In some embodiments, a sub-oxide layer SOL may be formed by the process of forming the dielectric layer DL, as illustrated in FIG. 4B. In the process of forming the dielectric layer DL, a portion of the seed layer SL may be oxidized to form the sub-oxide layer SOL. For example, the sub-oxide layer SOL may include the same metal as the metal included in the seed layer SL. The thickness of the sub-oxide layer SOL may range from about 5 Å to about 10 Å.

In certain embodiments, the sub-oxide layer SOL may not be formed unlike FIG. 4B. For example, the seed layer SL may contact the dielectric layer DL in certain embodiments.

Referring to FIGS. 3 and 4C, a second electrode E2 may be formed on the dielectric layer DL (S12). The second electrode E2 may be formed to be spaced apart from the first electrode E1 with the dielectric layer DL and the seed layer SL interposed therebetween. For example, the second electrode E2 may be formed using a CVD process or an ALD process.

The process of forming the second electrode E2 may be performed at a temperature of about 240 degrees Celsius or more, e.g., a temperature of about 240 degrees Celsius to about 400 degrees Celsius. At least a portion of the dielectric layer DL may be crystallized during the process of forming the second electrode E2. For example, the temperature of forming the second electrode E2 may be helpful for the dielectric layer DL to be crystallized. Since the seed layer SL including the seed material described above is adjacent to the dielectric layer DL, the dielectric material may be crystallized in the tetragonal crystal structure. When the process of forming the second electrode E2 is performed at a temperature lower than about 240 degrees Celsius, it may be difficult to form the second electrode E2 or to crystallize the dielectric layer DL. However, according to some embodiments, the process of forming the second electrode E2 may be performed at a temperature of about 240 degrees Celsius or more for the dielectric layer DL to be crystallized during the forming the second electrode E2. For example, the process of forming the second electrode E2 may be performed at a temperature of about 400 degrees Celsius or less, which may be beneficial to reduce or prevent a leakage current flowing through the dielectric layer DL.

Referring to FIGS. 1 and 3, a subsequent thermal treatment process may be performed (S13). For example, the subsequent thermal treatment process may induce further crystallization in the dielectric layer DL. In certain embodiments, the crystallization of the dielectric material in the tetragonal crystal structure may be completed by the subsequent thermal treatment process. For example, the subsequent thermal treatment process may correspond to a process of forming conductive interconnection lines (not shown) on the capacitor CA1 and may be performed at a temperature of about 240 degrees Celsius or more, e.g., a temperature of about 240 degrees Celsius to about 400 degrees Celsius. For example, the dielectric material may be crystallized in a tetragonal crystal structure while a conductive interconnection line electrically connected to the second electrode E2 is formed. In certain embodiments, the subsequent thermal treatment process may be a process other than forming the conductive interconnection lines.

According to the embodiments of the inventive concepts, the amorphous dielectric material may be affected by the seed layer SL, and thus the amorphous dielectric material may be crystallized in the tetragonal crystal structure at the relatively low temperature. For example, the amorphous dielectric material may be crystallized at about 240 degrees Celsius or more. For example, the amorphous dielectric material may be crystallized at a temperature of about 240 degrees Celsius to about 600 degrees Celsius. For example, the amorphous dielectric material may be crystallized at a temperature of about 240 degrees Celsius to about 400 degrees Celsius. The crystallization temperature of the dielectric material may correspond to the deposition temperature of the dielectric material, the temperature of the process of forming the second electrode E2, and/or the temperature of the process of forming the subsequent conductive interconnection lines (not shown). For example, the dielectric material may be crystallized in the tetragonal crystal structure without an additional high-temperature thermal treatment process, which is beneficial toward simplifying the manufacturing process of the capacitor CA1 and/or a semiconductor device including the capacitor CA1. When the dielectric layer DL, the second electrode E2 and the subsequent conductive interconnection lines are formed at high temperatures, thermal stress may be applied to the dielectric layer DL. However, according to the embodiments of the inventive concepts, the dielectric layer DL, the second electrode E2 and the subsequent conductive interconnection lines may be formed at low temperatures, which may be beneficial to reducing, inhibiting or preventing a leakage current from occurring through the dielectric layer DL by the thermal stress. In addition, processes for manufacturing the capacitor CA1 may be simplified.

Figure 5:
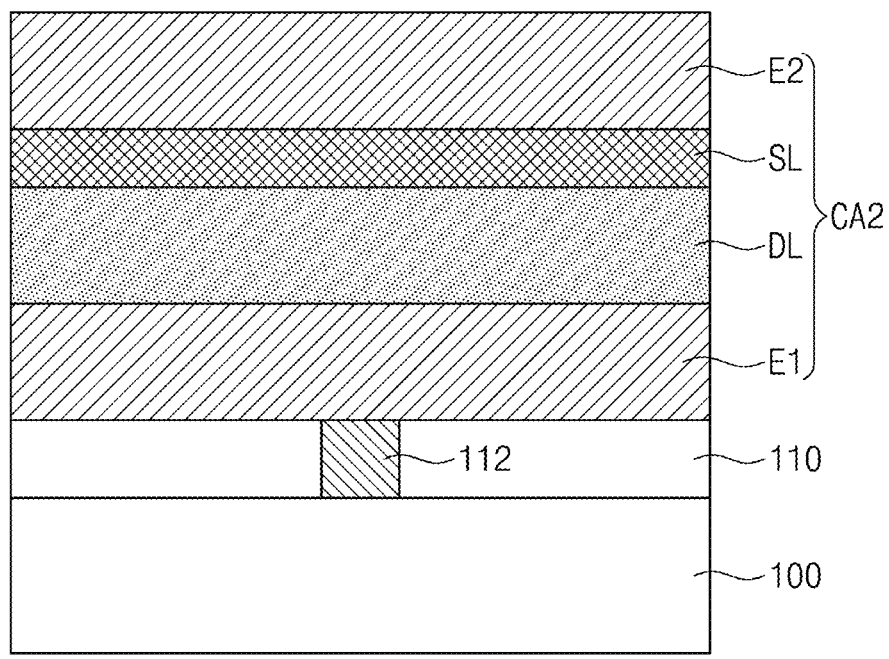
FIG. 5 is a cross-sectional view illustrating a capacitor according to some embodiments of the inventive concepts.

FIG. 5 is a cross-sectional view illustrating a capacitor according to some embodiments of the inventive concepts. Hereinafter, the same elements or components as described with reference to FIG. 1 will be indicated by the same reference numerals or the same reference designators, and the descriptions thereto will be omitted or mentioned briefly for the purpose of ease and convenience in explanation.

Referring to FIG. 5, an interlayer insulating layer 110 may be provided on a substrate 100, and a contact plug 112 may be provided in the interlayer insulating layer 110.

A capacitor CA2 may be provided on the interlayer insulating layer 110. The capacitor CA2 may include a first electrode E1, a second electrode E2, a dielectric layer DL, and a seed layer SL. The first electrode E1, the second electrode E2, and the dielectric layer DL may be substantially the same as the ones described with reference to FIG. 1.

The seed layer SL may be provided between the dielectric layer DL and the second electrode E2. The seed layer SL may include a seed material that assists the crystallization of a dielectric material, included in the dielectric layer DL, in a tetragonal crystal structure. The seed material may be substantially the same as the seed material described with reference to FIG. 1. The mechanism inducing the tetragonal crystal structure in the dielectric layer DL may be the same as the one described with respect to FIG. 1.

In some embodiments, the seed layer SL may be in contact with the dielectric layer DL, as illustrated in FIG. 5. For example, the sub-oxide layer described with reference to FIG. 1 may not be provided between the seed layer SL and the dielectric layer DL. In certain embodiments, the sub-oxide layer may be too thin, and thus it may not be observed between the seed layer SL and the dielectric layer DL.

In certain embodiments, the sub-oxide layer SOL described with reference to FIG. 1 may be provided between the seed layer SL and the dielectric layer DL, unlike FIG. 5.

Figure 6:
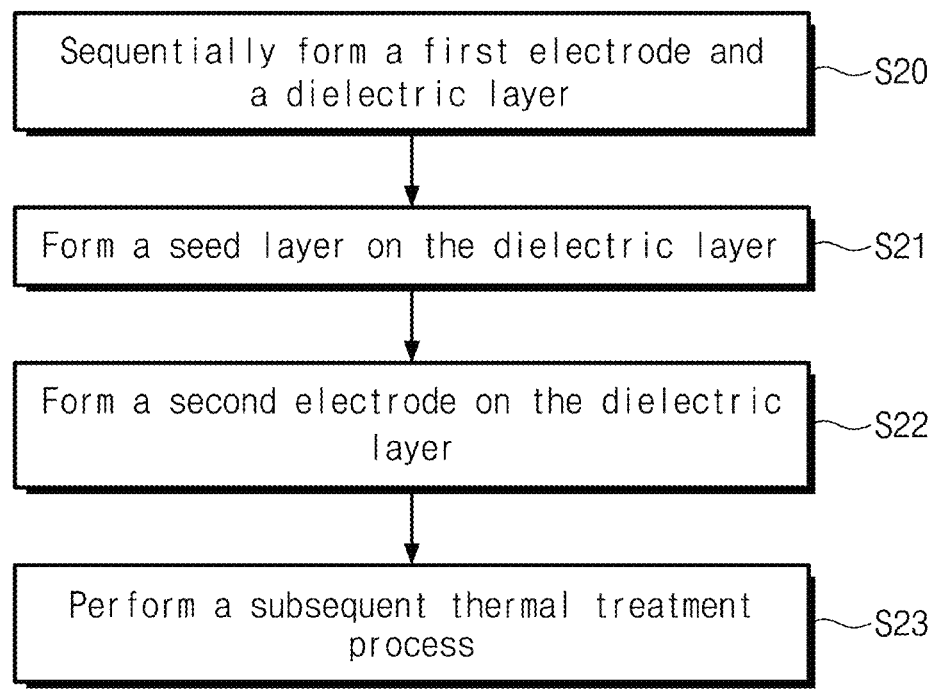
FIG. 6 is a flowchart illustrating a method of manufacturing a capacitor according to some embodiments of the inventive concepts.
Figure 7A:
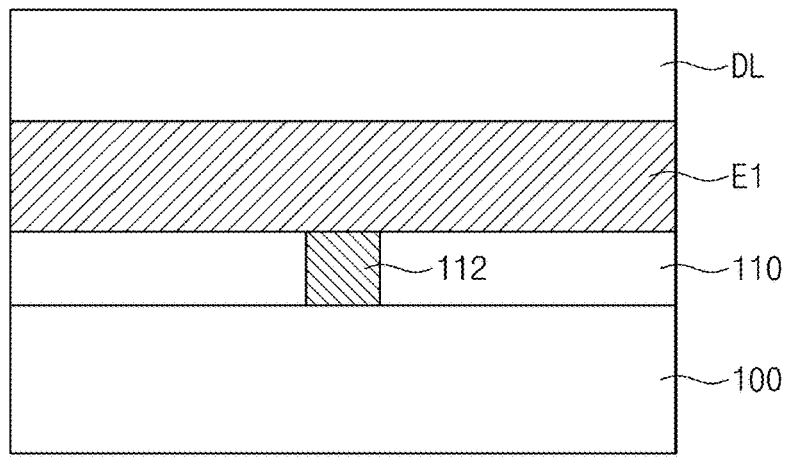
FIGS. 7A to 7C are cross-sectional views illustrating a method of manufacturing a capacitor according to some embodiments of the inventive concepts.
Figure 7B:
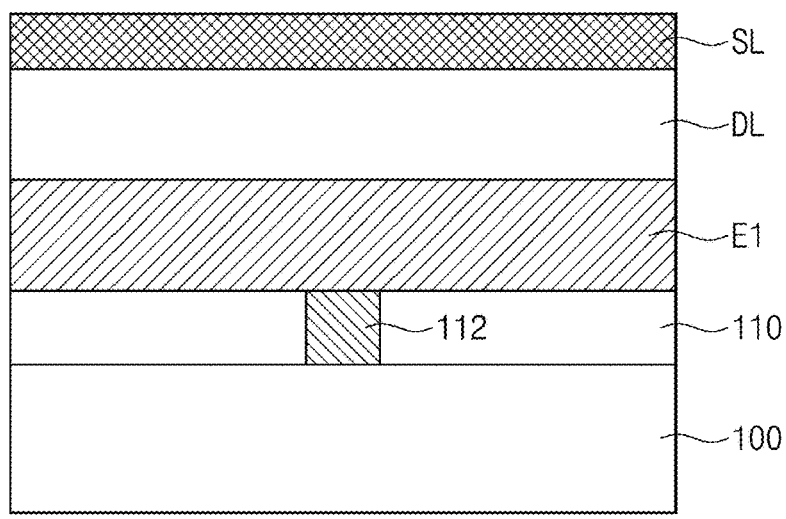
Figure 7C:
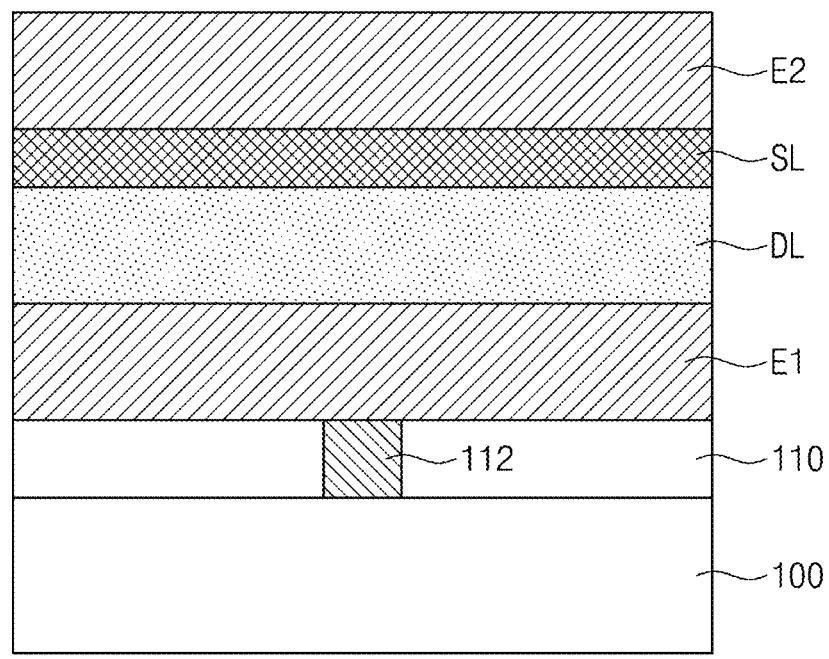

FIG. 6 is a flowchart illustrating a method of manufacturing a capacitor according to some embodiments of the inventive concepts. FIGS. 7A to 7C are cross-sectional views illustrating a method of manufacturing a capacitor according to some embodiments of the inventive concepts. For example, FIGS. 6 and 7A to 7C may be views illustrating a method of manufacturing the capacitor described with reference to FIG. 5. Hereinafter, the same elements or components as described with reference to FIGS. 1 and 5 will be indicated by the same reference numerals or the same reference designators, and the descriptions thereto will be omitted or mentioned briefly for the purpose of ease and convenience in explanation.

Referring to FIGS. 6 and 7A, an interlayer insulating layer 110 and a contact plug 112 may be formed on a substrate 100. The formation of the interlayer insulating layer 110 and the contact plug 112 may be substantially the same as the one described with reference to FIGS. 3 and 4A.

A first electrode E1 and a dielectric layer DL may be sequentially formed on the interlayer insulating layer 110 (S20).

The first electrode E1 may be formed on the interlayer insulating layer 110. The first electrode E1 may be electrically connected to the contact plug 112. For example, the first electrode E1 may be formed using a CVD process or an ALD process.

The dielectric layer DL may be formed on the first electrode E1. The dielectric layer DL may include an amorphous dielectric material immediately after the formation of the dielectric layer DL. For example, the dielectric layer DL may include amorphous hafnium oxide or amorphous zirconium oxide. For example, the dielectric layer DL may be formed by a CVD process or an ALD process.

Referring to FIGS. 6 and 7B, a seed layer SL may be formed on the dielectric layer DL (S21). For example, the seed layer SL may be formed using a CVD process or an ALD process.

The seed layer SL may include a seed material that assists the crystallization of a dielectric material, included in the dielectric layer DL, in a tetragonal crystal structure. The seed material may be substantially the same as the one described above with reference to FIG. 1. For example, the seed material may satisfy at least one of the aforementioned lattice constant condition or the aforementioned bond length condition. For example, the seed material may satisfy the aforementioned conductive condition, the aforementioned work function condition, and/or the aforementioned oxide band gap condition. For example, the seed material may include cobalt, nickel, copper, or $Co_4N$. Alternatively, the seed material may include cobalt nitride of which a composition ratio is similar to that of $Co_4N$. For example, the seed material may include $CO_xN$ where $3.5<x<4.5$.

Unlike the process described with reference to FIG. 4B, the sub-oxide layer may not be formed between the seed layer SL and the dielectric layer DL. Alternatively, a very thin sub-oxide layer may be formed between the seed layer SL and the dielectric layer DL, and thus the sub-oxide layer may not be observed. These may be because a temperature of the process of forming the seed layer SL is lower than a temperature of the process of forming the dielectric layer DL.

Referring to FIGS. 6 and 7C, a second electrode E2 may be formed on the seed layer SL (S22). The second electrode E2 may be formed to be spaced apart from the first electrode E1 with the seed layer SL and the dielectric layer DL interposed therebetween. For example, the second electrode E2 may be formed using a CVD process or an ALD process.

The amorphous dielectric material included in the dielectric layer DL may be affected by the seed layer SL, and thus the amorphous dielectric material may be crystallized in the tetragonal crystal structure at a relatively low temperature. For example, the amorphous dielectric material may be crystallized at about 240 degrees Celsius or more, e.g., a temperature of about 240 degrees Celsius to about 400 degrees Celsius.

The process of forming the second electrode E2 may be performed at a temperature of about 240 degrees Celsius or more, e.g., a temperature of about 240 degrees Celsius to about 400 degrees Celsius. For example, at least a portion of the dielectric layer DL may be crystallized during the process of forming the second electrode E2. Since the seed layer SL including the seed material described above is adjacent to the dielectric layer DL, the dielectric material may be crystallized in the tetragonal crystal structure.

Referring to FIGS. 5 and 6, a subsequent thermal treatment process may be performed (S23). For example, the subsequent thermal treatment process may induce further crystallization in the dielectric layer DL. In certain embodiments, the crystallization of the dielectric material in the tetragonal crystal structure may be completed by the subsequent thermal treatment process. For example, the subsequent thermal treatment process may correspond to a process of forming conductive interconnection lines (not shown) on the capacitor CA2 and may be performed at a temperature of about 240 degrees Celsius or more, e.g., a temperature of about 240 degrees Celsius to about 400 degrees Celsius. For example, the dielectric material may be crystallized in a tetragonal crystal structure while a conductive interconnection line electrically connected to the second electrode E2 is formed. In certain embodiments, the subsequent thermal treatment process may be a process other than forming the conductive interconnection lines.

Figure 8:
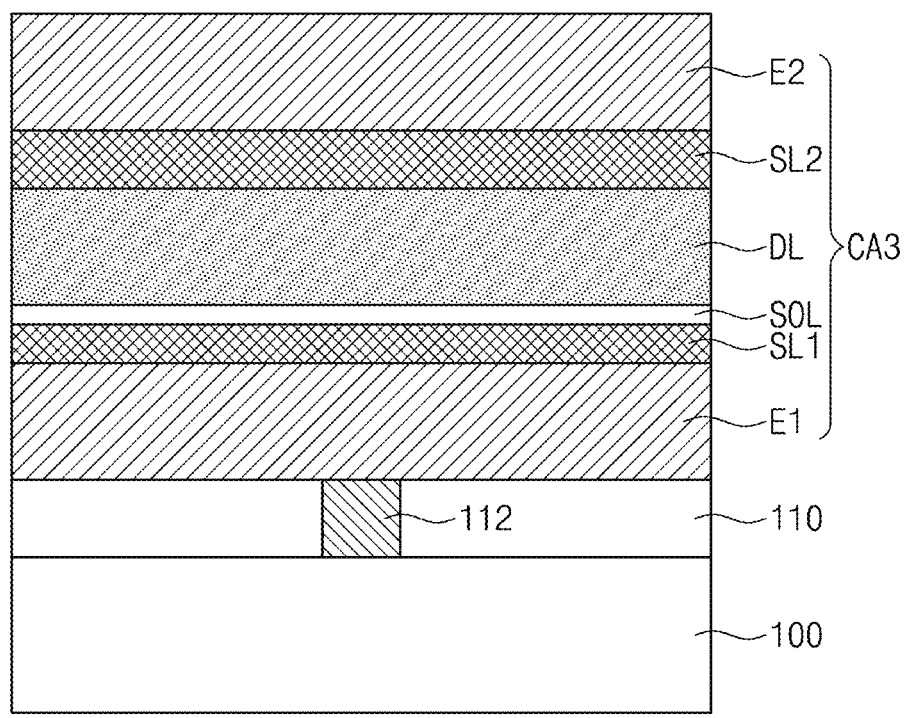
FIG. 8 is a cross-sectional view illustrating a capacitor according to some embodiments of the inventive concepts.

FIG. 8 is a cross-sectional view illustrating a capacitor according to some embodiments of the inventive concepts. Hereinafter, the same elements or components as described with reference to FIG. 1 and/or FIG. 5 will be indicated by the same reference numerals or the same reference designators, and the descriptions thereto will be omitted or mentioned briefly for the purpose of ease and convenience in explanation.

Referring to FIG. 8, an interlayer insulating layer 110 may be provided on a substrate 100, and a contact plug 112 may be provided in the interlayer insulating layer 110.

A capacitor CA3 may be provided on the interlayer insulating layer 110. The capacitor CA3 may include a first electrode E1, a second electrode E2, a dielectric layer DL, a first seed layer SL1, and a second seed layer SL2. The first electrode E1, the second electrode E2, and the dielectric layer DL may be substantially the same as the ones described with reference to FIG. 1.

The first seed layer SL1 may be provided between the first electrode E1 and the dielectric layer DL. The first seed layer SL1 may be substantially the same as the seed layer SL described with reference to FIG. 1.

The second seed layer SL2 may be provided between the second electrode E2 and the dielectric layer DL. The second seed layer SL2 may be substantially the same as the seed layer SL described with reference to FIG. 5.

In some embodiments, the capacitor CA3 may include a sub-oxide layer SOL disposed between the first seed layer SL1 and the dielectric layer DL, as illustrated in FIG. 8. The sub-oxide layer SOL may be substantially the same as the sub-oxide layer SOL described with reference to FIG. 1.

In certain embodiments, the capacitor CA3 may not include the sub-oxide layer SOL, unlike FIG. 8.

Figure 9:
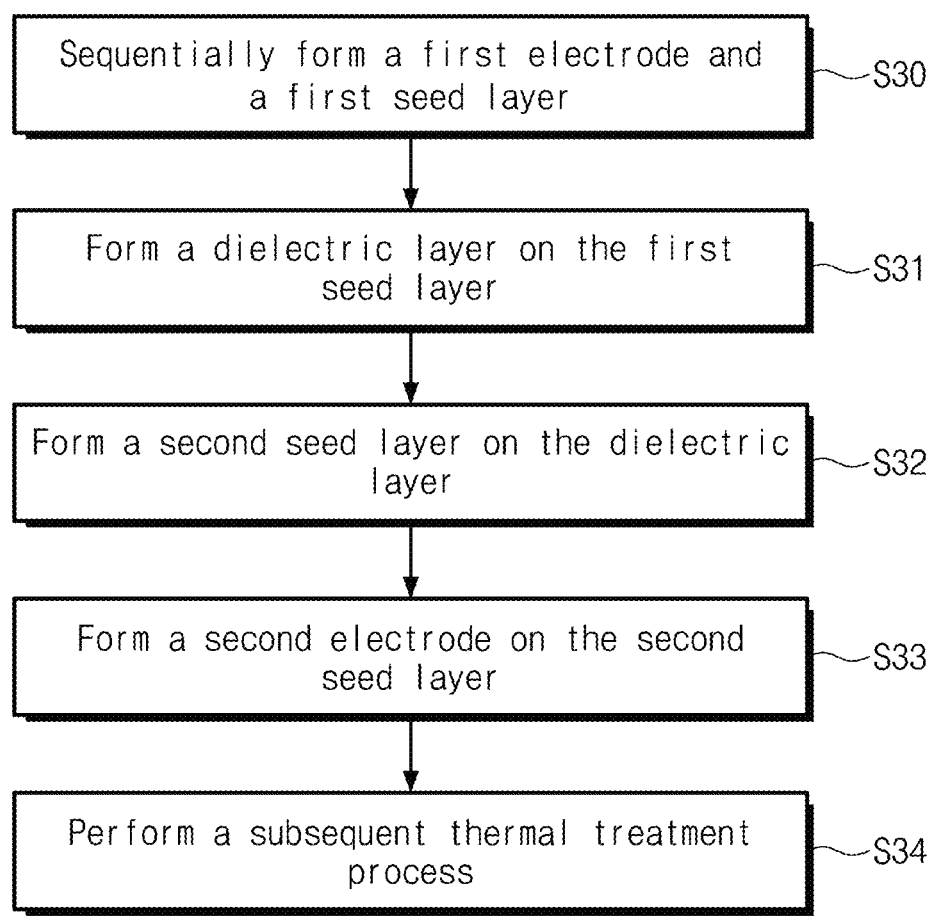
FIG. 9 is a flowchart illustrating a method of manufacturing a capacitor according to some embodiments of the inventive concepts.
Figure 10A:
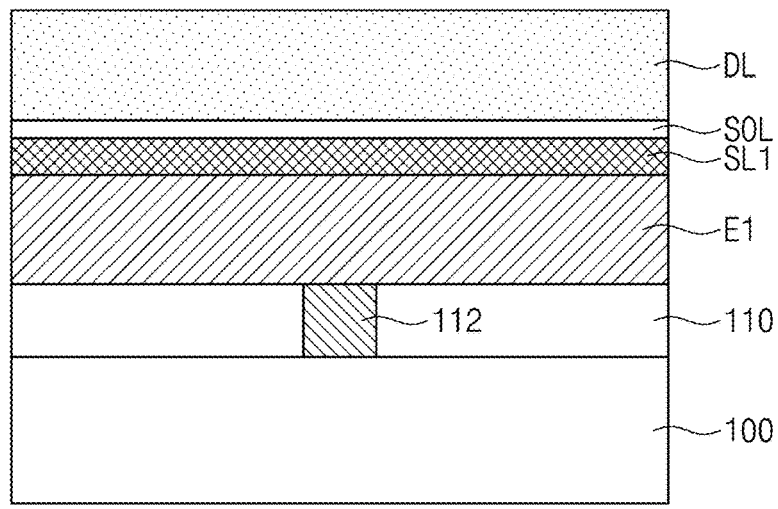
FIGS. 10A to 10C are cross-sectional views illustrating a method of manufacturing a capacitor according to some embodiments of the inventive concepts.
Figure 10B:
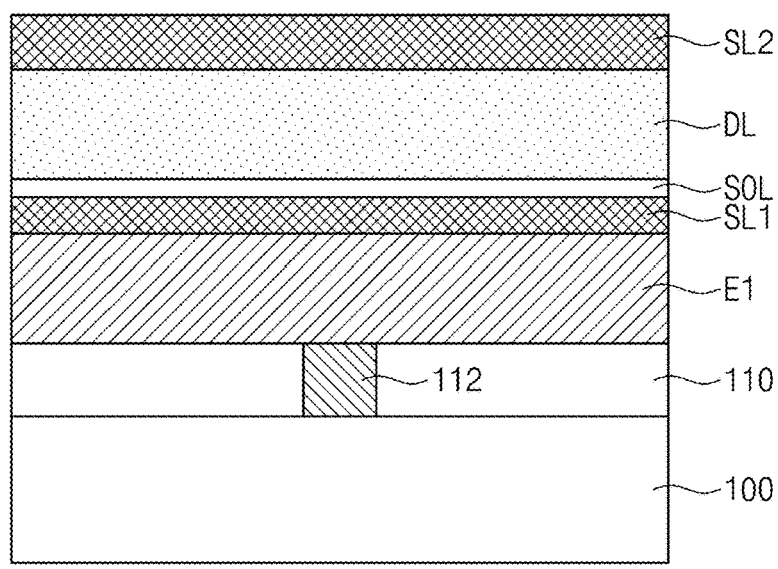
Figure 10C:
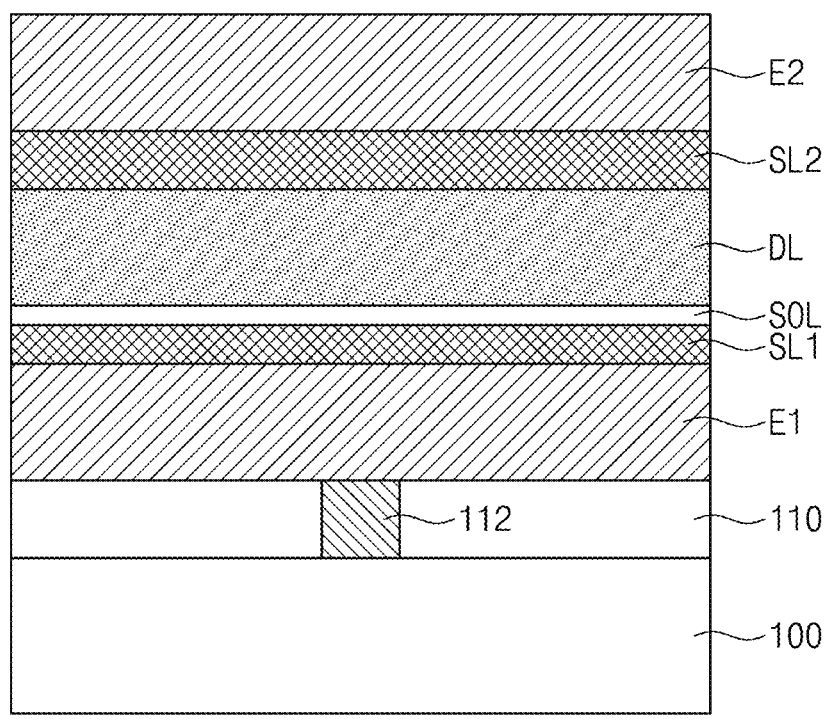

FIG. 9 is a flowchart illustrating a method of manufacturing a capacitor according to some embodiments of the inventive concepts. FIGS. 10A to 10C are cross-sectional views illustrating a method of manufacturing a capacitor according to some embodiments of the inventive concepts. For example, FIGS. 9 and 10A to 10C may be views illustrating a method of manufacturing the capacitor described with reference to FIG. 8. Hereinafter, the same elements or components as described with reference to FIGS. 1, 5, and 8 will be indicated by the same reference numerals or the same reference designators, and the descriptions thereto will be omitted or mentioned briefly for the purpose of ease and convenience in explanation.

Referring to FIGS. 9 and 10A, an interlayer insulating layer 110 and a contact plug 112 may be formed on a substrate 100. The formation of the interlayer insulating layer 110 and the contact plug 112 may be substantially the same as the one described with reference to FIGS. 3 and 4A.

A first electrode E1 and a first seed layer SL1 may be sequentially formed on the interlayer insulating layer 110 (S30). Processes of forming the first electrode E1 and the first seed layer SL1 may be substantially the same as the processes of forming the first electrode E1 and the seed layer SL, described with reference to FIGS. 3 and 4A. The first seed layer SL1 may include a seed material that assists the crystallization of a dielectric material, included in a dielectric layer DL, to be formed in a subsequent process. For example, the dielectric material in the dielectric layer DL may be formed in a tetragonal crystal structure by an interaction with the seed material.

A dielectric layer DL may be formed on the first seed layer SL1 (S31). A process of forming the dielectric layer DL may be substantially the same as the process of forming the dielectric layer DL, described with reference to FIGS. 3 and 4B. The dielectric layer DL may include an amorphous dielectric material immediately after the formation of the dielectric layer DL. For example, the dielectric layer DL may include amorphous hafnium oxide or amorphous zirconium oxide. In certain embodiments, at least a portion of the dielectric layer DL may be crystallized in the tetragonal crystal structure during the deposition process. In this case, immediately after the formation of the dielectric layer DL, the dielectric layer DL may include both the amorphous dielectric material and the dielectric material having the tetragonal crystal structure. The formation of the dielectric layer DL may be performed at a temperature of about 240 degrees Celsius or more, e.g., a temperature of about 240 degrees Celsius to 290 degrees Celsius.

Referring to FIGS. 9 and 10B, a second seed layer SL2 may be formed on the dielectric layer DL (S32). A process of forming the second seed layer SL2 may be substantially the same as the process of forming the seed layer SL, described with reference to FIGS. 6 and 7B. The second seed layer SL2 may include a seed material that assists the crystallization of the dielectric material, included in the dielectric layer DL, in the tetragonal crystal structure.

Referring to FIGS. 9 and 10C, a second electrode E2 may be formed on the second seed layer SL2 (S33). A process of forming the second electrode E2 may be substantially the same as the process of forming the second electrode E2, described with reference to FIGS. 6 and 7C. At least a portion of the dielectric layer DL may be crystallized by the process of forming the second electrode E2. Since the first and second seed layers SL1 and SL2 including the seed material described above are adjacent to the dielectric layer DL, the dielectric material may be crystallized in the tetragonal crystal structure.

Referring to FIGS. 8 and 9, a subsequent thermal treatment process may be performed (S34). For example, the subsequent thermal treatment process may induce further crystallization in the dielectric layer DL. In certain embodiments, the crystallization of the dielectric material in the tetragonal crystal structure may be completed through the subsequent thermal treatment process. For example, the subsequent thermal treatment process may correspond to a process of forming conductive interconnection lines (not shown) on the capacitor CA3 and may be performed at a temperature of about 240 degrees Celsius or more, e.g., a temperature of about 240 degrees Celsius to about 400 degrees Celsius. For example, the dielectric material may be crystallized in a tetragonal crystal structure while a conductive interconnection line electrically connected to the second electrode E2 is formed. In certain embodiments, the subsequent thermal treatment process may be a process other than forming the conductive interconnection lines.

[Analysis Results of Crystal Structure of Hafnium Oxide]

Figure 11A:
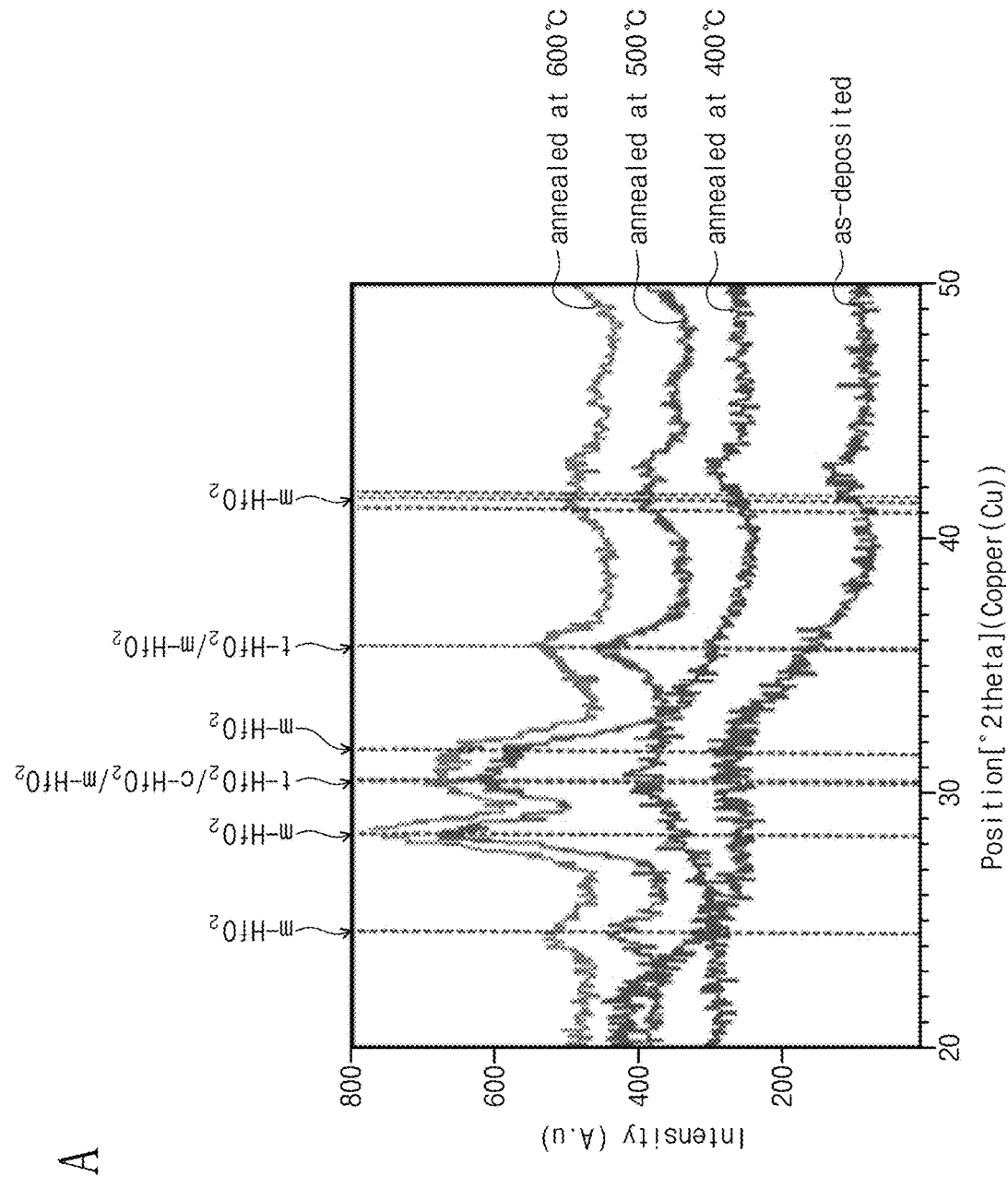
FIG. 11A is a graph illustrating results of X-ray diffraction analysis of a crystal structure of hafnium oxide formed on a general electrode, e.g., an electrode without a seed layer between the hafnium oxide and the electrode.

FIG. 11A is a graph illustrating results of X-ray diffraction analysis of a crystal structure of hafnium oxide formed on a general electrode. For example, the general electrode may be substantially the same as one of the electrodes E1 and E2 described in the present disclosure but does not include a seed layer between the electrode and the hafnium oxide layer. For example, hafnium oxide was formed on titanium nitride and was thermally treated (or annealed) at a certain temperature. Thereafter, the hafnium oxide was analyzed through X-ray diffraction analysis. For example, FIG. 11A illustrates a distribution of hafnium oxide structures in a hafnium oxide layer formed on a titanium nitride electrode without a seed layer between the hafnium oxide layer and the titanium nitride electrode. The titanium nitride electrode and the hafnium oxide layer formed on the titanium nitride was thermally treated (or annealed) in different temperatures before the hafnium oxide structures are measured.

Referring to FIG. 11A, it may be recognized that hafnium oxide (m-$HfO_2$) having the monoclinic crystal structure and hafnium oxide (t-$HfO_2$) having the tetragonal crystal structure exist together in the hafnium oxide layer when the hafnium oxide layer is formed on the general electrode and is thermally treated (or annealed) at a temperature of about 240 degrees Celsius to about 600 degrees Celsius.

Figure 11B:
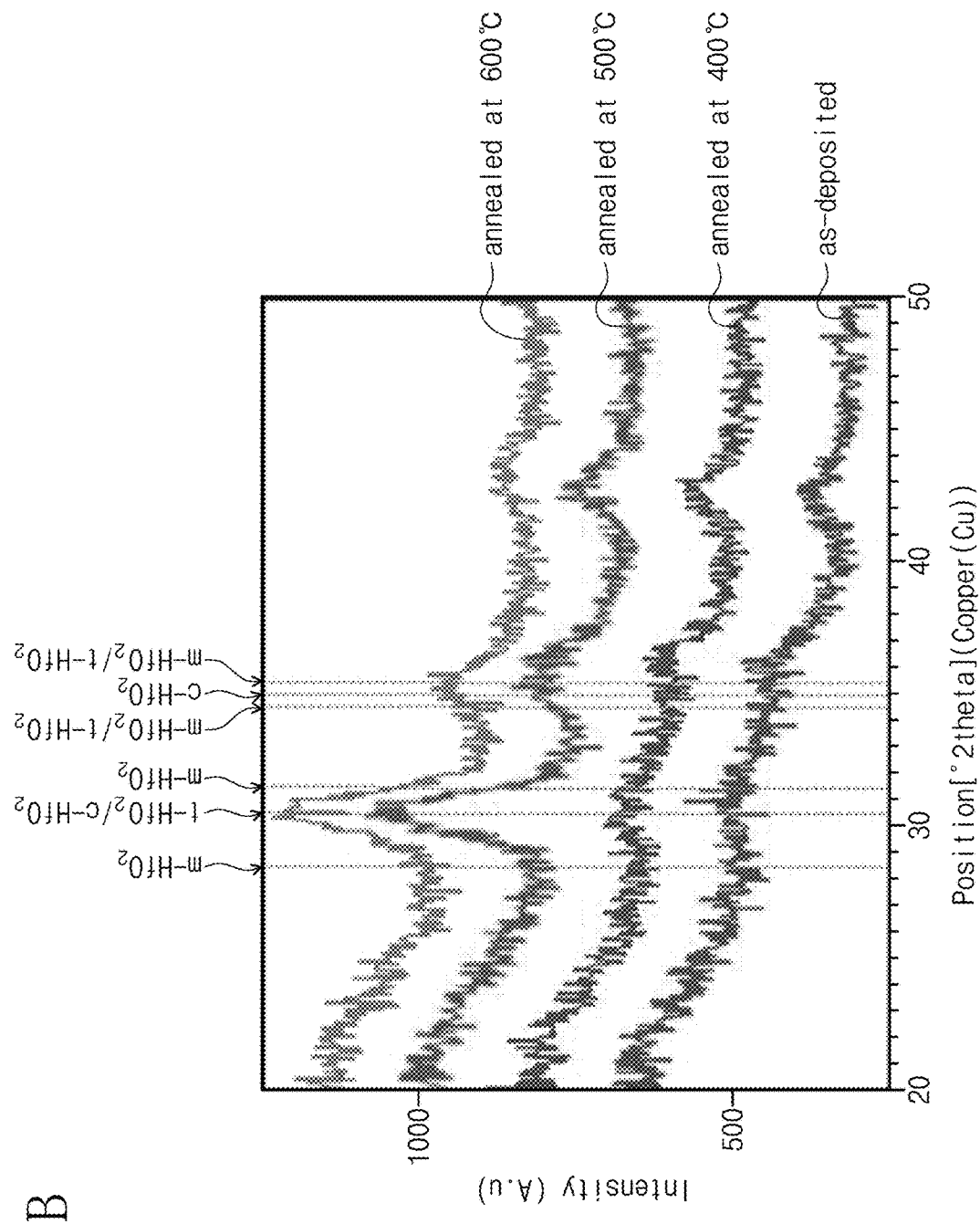
FIG. 11B is a graph illustrating results of X-ray diffraction analysis of a crystal structure of hafnium oxide formed on a seed layer according to some embodiments of the inventive concepts.

FIG. 11B is a graph illustrating results of X-ray diffraction analysis of a crystal structure of a hafnium oxide layer formed on a seed layer according to some embodiments of the inventive concepts. For example, a hafnium oxide layer was formed on $Co_4N$ and was thermally treated (or annealed) at a certain temperature. Thereafter, the hafnium oxide was analyzed through X-ray diffraction analysis.

Referring to FIG. 11B, it may be recognized that hafnium oxide (t-$HfO_2$) having the tetragonal crystal structure is mainly formed in the hafnium oxide layer when the hafnium oxide layer is formed on the seed layer according to certain embodiments of the inventive concepts and is thermally treated (or annealed) at a temperature of about 240 degrees Celsius to about 600 degrees Celsius.

[Analysis Results of Crystal Structure of Zirconium Oxide According to Thickness]

Figure 11C:
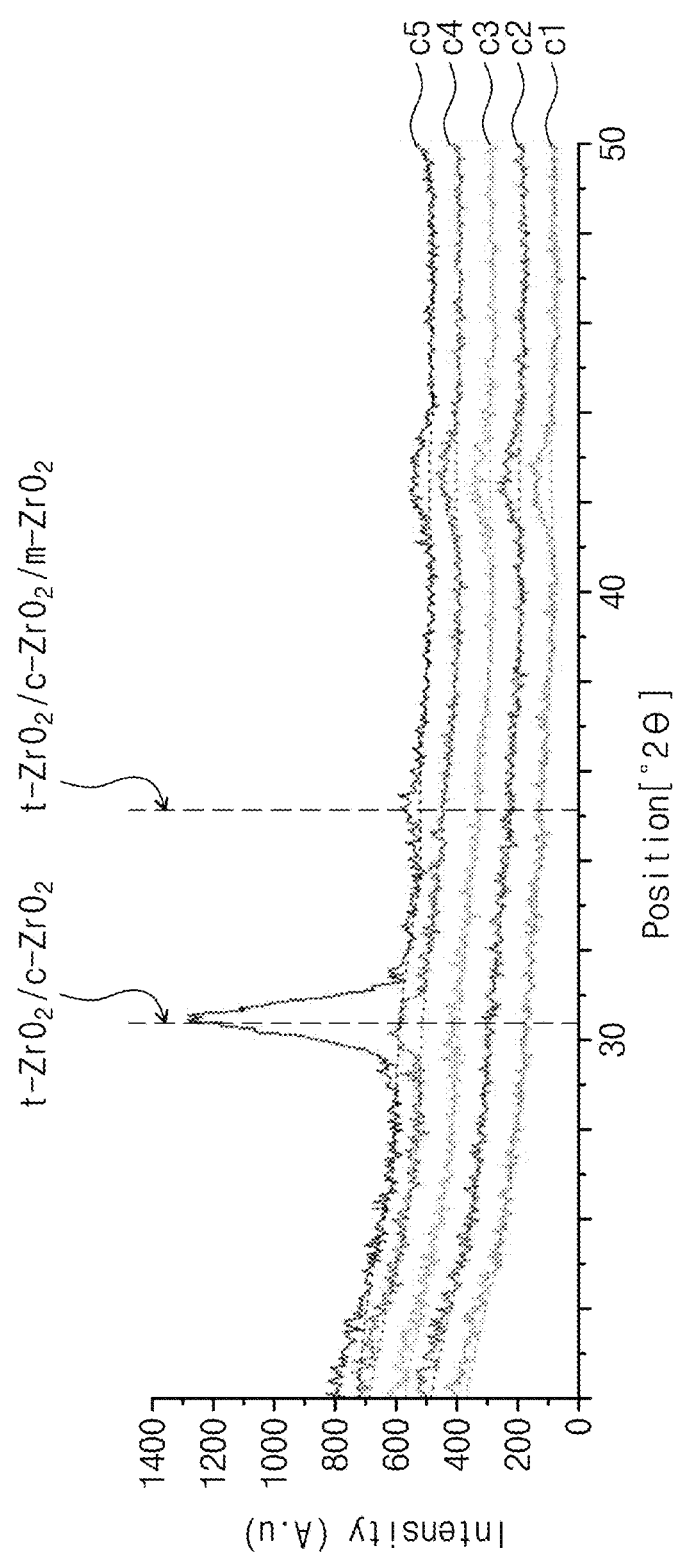
FIG. 11C is a graph illustrating results of X-ray diffraction analysis of crystal structures of zirconium oxide layers which are respectively formed on general electrodes (e.g., electrodes without a seed layer between a hafnium oxide and the electrodes) and have different thicknesses from each other.

FIG. 11C is a graph illustrating results of X-ray diffraction analysis of crystal structures of zirconium oxide layers which are respectively formed on general electrodes and have different thicknesses from each other. For example, each of the general electrodes may be substantially the same as one of the electrodes E1 and E2 described in the present disclosure but does not include a seed layer between the electrode and the zirconium oxide layer. For example, zirconium oxide layers having thicknesses of 41.1 Å, 60.4 Å, 81.2 Å, 96.7 Å and 120.2 Å were formed on titanium nitride electrodes, respectively, and the titanium nitride electrodes and the zirconium oxide layers formed on the titanium nitride electrodes were thermally treated (i.e., annealed) at a certain temperature. Thereafter, the zirconium oxide layers were analyzed by X-ray diffraction analysis. In FIG. 11C, samples c1, c2, c3, c4 and c5 show the analysis results of the zirconium oxide layers of 41.1 Å, 60.4 Å, 81.2 Å, 96.7 Å and 120.2 Å, respectively.

Referring to FIG. 11C, when the thicknesses of the zirconium oxide layers were relatively small like the samples c1, c2 and c3 (e.g., 85 Å or less), the zirconium oxide (t-$ZrO_2$) having the tetragonal crystal structure was not formed. However, when the thicknesses of the zirconium oxide layers were relatively large like the samples c4 and c5 (e.g., greater than 85 Å), the zirconium oxide (t-$ZrO_2$) having the tetragonal crystal structure was formed.

Figure 11D:
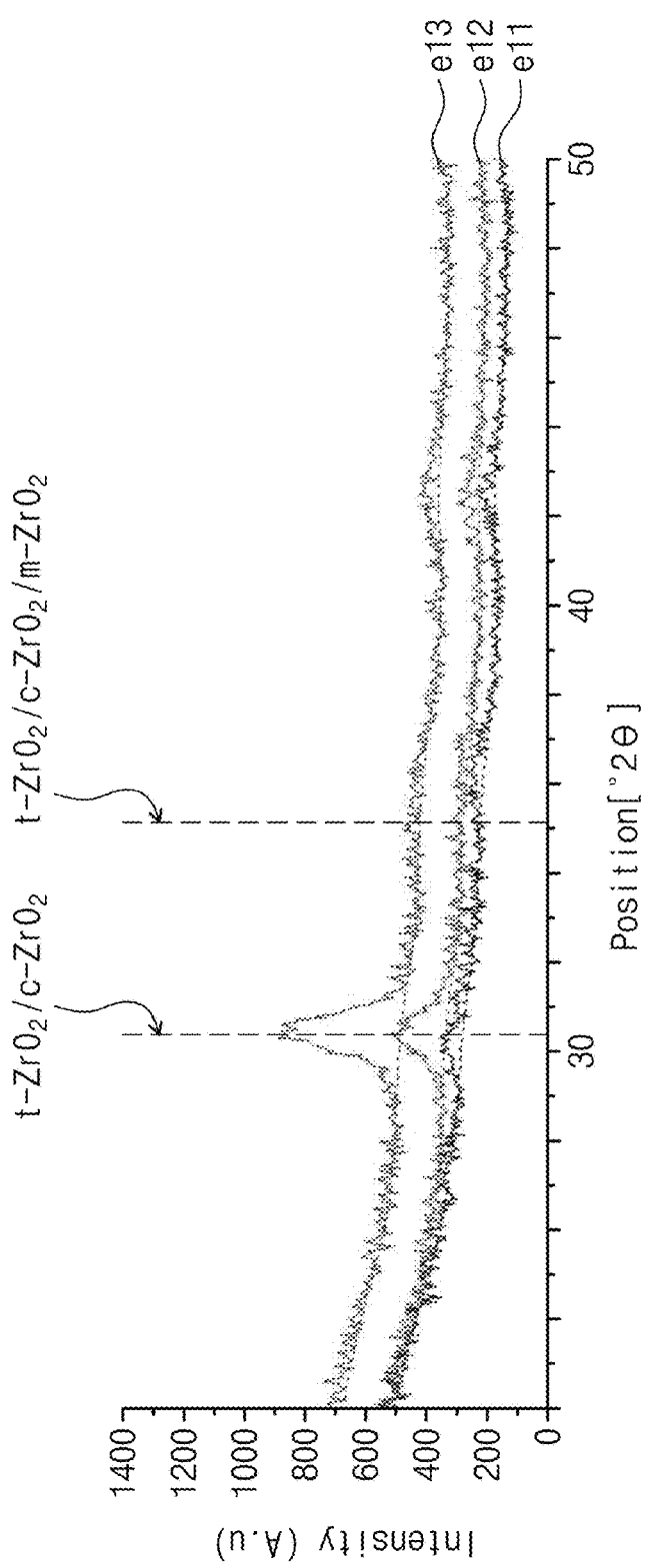
FIG. 11D is a graph illustrating results of X-ray diffraction analysis of crystal structures of zirconium oxide layers according to embodiments of the inventive concepts, which have different thicknesses from each other.

FIG. 11D is a graph illustrating results of X-ray diffraction analysis of crystal structures of zirconium oxide layers according to embodiments of the inventive concepts, which have different thicknesses from each other. In FIG. 11D, zirconium oxide layers were formed on seed layers, respectively. For example, zirconium oxide layers having thicknesses of 64.6 Å, 87.5 Å and 110.4 Å were formed on cobalt (Co) layers, respectively, and the cobalt layers and the zirconium layers respectively formed on the cobalt layers were thermally treated (i.e., annealed). Thereafter, the zirconium oxide layers on the cobalt layers were analyzed by X-ray diffraction analysis. Here, the thickness of each of the cobalt layers was about 40 Å. In FIG. 11D, samples e11, e12 and e13 show the analysis results of the zirconium oxide layers having thicknesses of 64.6 Å, 87.5 Å and 110.4 Å, respectively.

Referring to FIG. 11D, when the zirconium oxide was formed on the seed layer, the zirconium oxide (t-$ZrO_2$) having the tetragonal crystal structure was formed regardless of the thickness of the zirconium oxide. For example, the zirconium oxide (t-$ZrO_2$) having the tetragonal crystal structure was observed in both cases in which the thickness of the zirconium oxide was relatively small like the sample e11 (e.g., 85 Å or less) and in which the thicknesses of the zirconium oxide layers were relatively great like the samples e12 and e13 (e.g., greater than 85 Å).

Figure 11E:
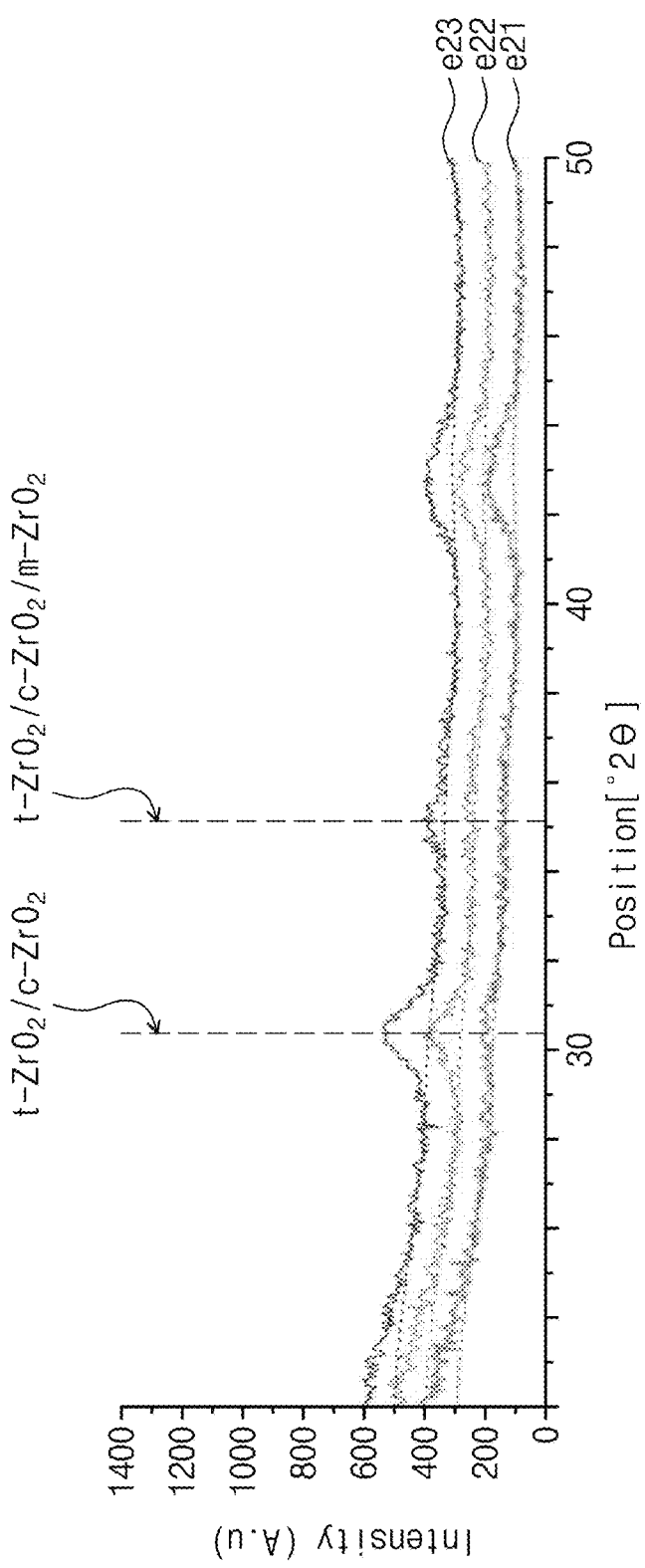
FIG. 11E is a graph illustrating results of X-ray diffraction analysis of crystal structures of zirconium oxide layers according to embodiments of the inventive concepts, which have different thicknesses from each other.

FIG. 11E is a graph illustrating results of X-ray diffraction analysis of crystal structures of zirconium oxide layers according to embodiments of the inventive concepts, which have different thicknesses from each other. In FIG. 11E, zirconium oxide layers were formed on seed layers. For example, zirconium oxide layers having thicknesses of 52.8 Å, 76.6 Å and 103.4 Å were formed on nickel (Ni) layers, respectively, and the nickel layers and the zirconium oxide layers respectively formed on the nickel layers were thermally treated (i.e., annealed). Thereafter, the zirconium oxide layers on the nickel layers were analyzed by X-ray diffraction analysis. Here, the thickness of each of the nickel layers was 40 Å. In FIG. 11E, samples e21, e22 and e23 show the analysis results of the zirconium oxide layers having the thicknesses of 52.8 Å, 76.6 Å and 103.4 Å, respectively.

Referring to FIG. 11E, when the zirconium oxide was formed on the seed layer, the zirconium oxide (t-$ZrO_2$) having the tetragonal crystal structure was formed regardless of the thickness of the zirconium oxide. For example, the zirconium oxide (t-$ZrO_2$) having the tetragonal crystal structure was observed in both the case in which the thicknesses of the zirconium oxide layers were relatively small like the samples e21 and e22 (e.g., 85 Å or less) and the case in which the thickness of the zirconium oxide was relatively great like the sample e23 (e.g., greater than 85 Å).

[Analysis Results of Crystal Structure of Zirconium Oxide According to Temperature Condition]

Figure 11F:
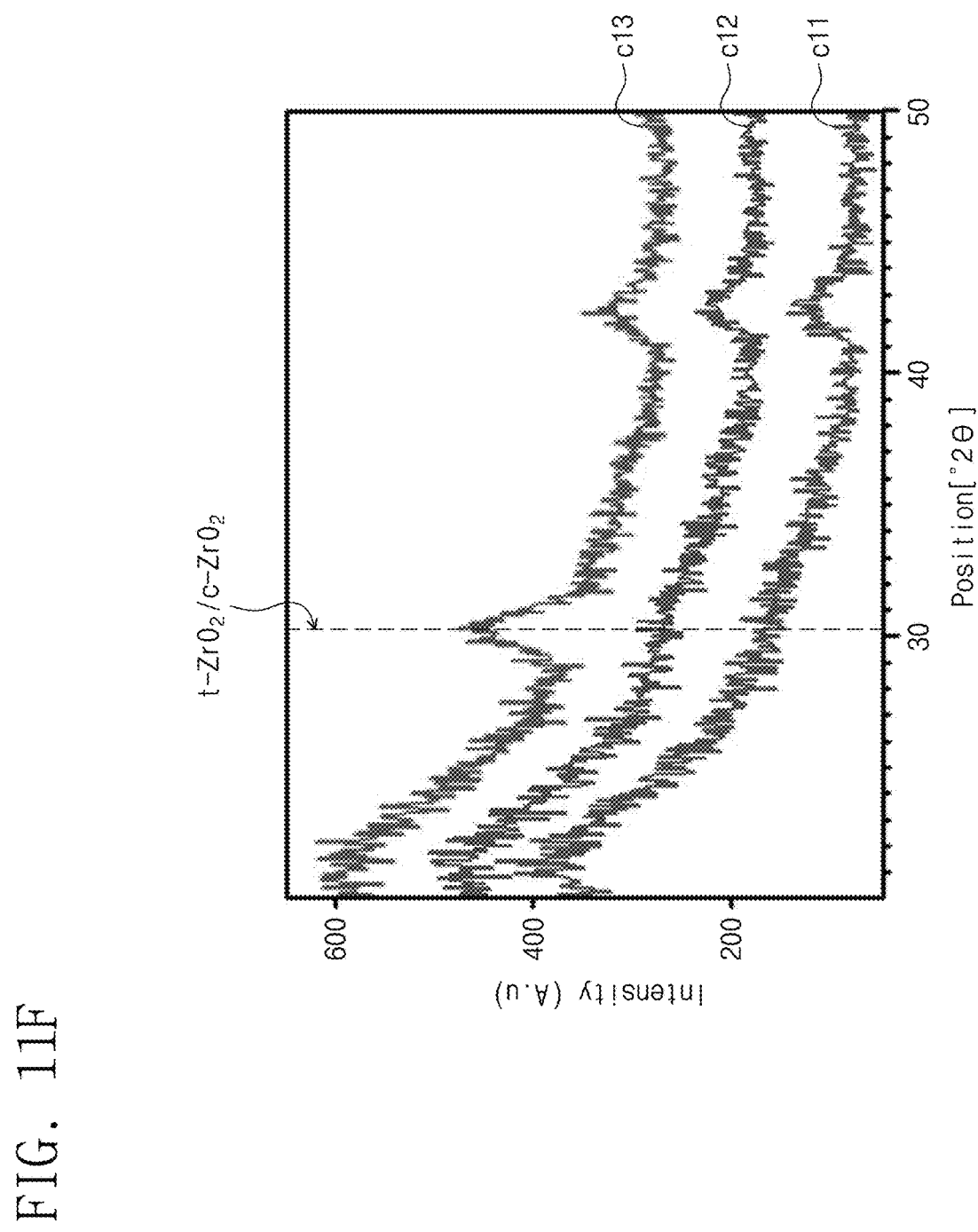
FIG. 11F is a graph illustrating results of X-ray diffraction analysis of crystal structures of zirconium oxide layers which are respectively formed on general electrodes (e.g., electrodes without a seed layer between a hafnium oxide and the electrodes) at different temperatures from each other.

FIG. 11F is a graph illustrating results of X-ray diffraction analysis of crystal structures of zirconium oxide layers which are respectively formed on general electrodes at different temperatures from each other. For example, each of the general electrodes may be substantially the same as one of the electrodes E1 and E2 described in the present disclosure but does not include a seed layer between the electrode and the zirconium oxide. For example, zirconium oxide layers were formed (deposited) on titanium nitride electrodes at 250° C., 275° C. and 300° C., and they were analyzed through X-ray diffraction analysis. Here, the thickness of each of the zirconium oxide layers was 58 Å, and the seed layer was not formed. In FIG. 11F, samples c11, c12 and c13 show the analysis results of the zirconium oxide layers formed at 250° C., 275° C. and 300° C., respectively.

Referring to FIG. 11F, when the zirconium oxide layers were formed at relatively low temperatures (e.g., 290° C. or less) like the samples c11 and c12, the zirconium oxide (t-$ZrO_2$) having the tetragonal crystal structure was not formed in the zirconium oxide layers. However, when the zirconium oxide layer was formed at a relatively high temperature (e.g., greater than 290° C.) like the sample c13, the zirconium oxide (t-$ZrO_2$) having the tetragonal crystal structure was formed.

Figure 11G:
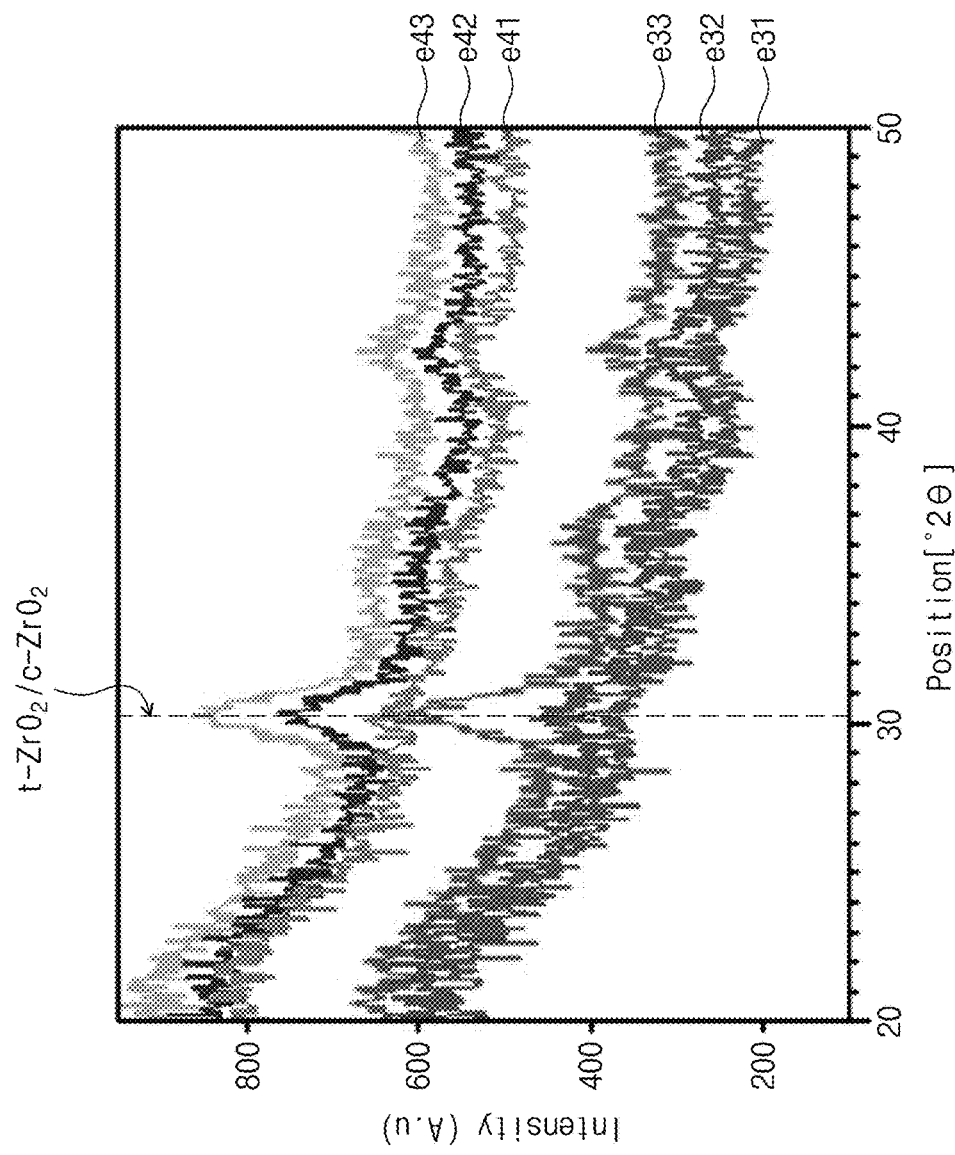
FIG. 11G is a graph illustrating results of X-ray diffraction analysis of crystal structures of zirconium oxide layers which are respectively formed on seed layers at different temperatures from each other.

FIG. 11G is a graph illustrating results of X-ray diffraction analysis of crystal structures of zirconium oxide layers which are respectively formed on seed layers at different temperatures from each other. For example, zirconium oxide layers were formed (deposited) on cobalt (Co) layers at 250° C., 275° C. and 300° C., respectively, and they were analyzed by X-ray diffraction analysis. In samples e31, e32 and e33, the thickness of each of the cobalt layers was 40 Å. The samples e31, e32 and e33 show the analysis results of the zirconium oxide layers formed on the cobalt layers of 40 Å at 250° C., 275° C. and 300° C., respectively. In samples e41, e42 and e43, the thickness of each of the cobalt layers was 20 Å. The samples e41, e42 and e43 show the analysis results of the zirconium oxide layers formed on the cobalt layers of 20 Å at 250° C., 275° C. and 300° C., respectively. Here, thicknesses of the zirconium oxide layers of the samples e31, e32, e33, e41, e42 and e43 were 61 Å, 61 Å, 68 Å, 58 Å, 62 Å, and 64 Å, respectively.

Referring to FIG. 11G, the zirconium oxide (t-$ZrO_2$) having the tetragonal crystal structure was formed when the zirconium oxide layers were formed at relatively low temperatures (e.g., 290° C. or less) like the samples e31, e32, e41 and e42. The zirconium oxide (t-$ZrO_2$) having the tetragonal crystal structure was formed when the zirconium oxide layers were formed at relatively high temperatures (e.g., greater than 290° C.) like the samples e33 and e43. For example, the zirconium oxide (t-$ZrO_2$) having the tetragonal crystal structure was formed even though the seed layers (i.e., the cobalt layers) were relatively thin as the samples e41, e42 and e43.

Figure 11H:
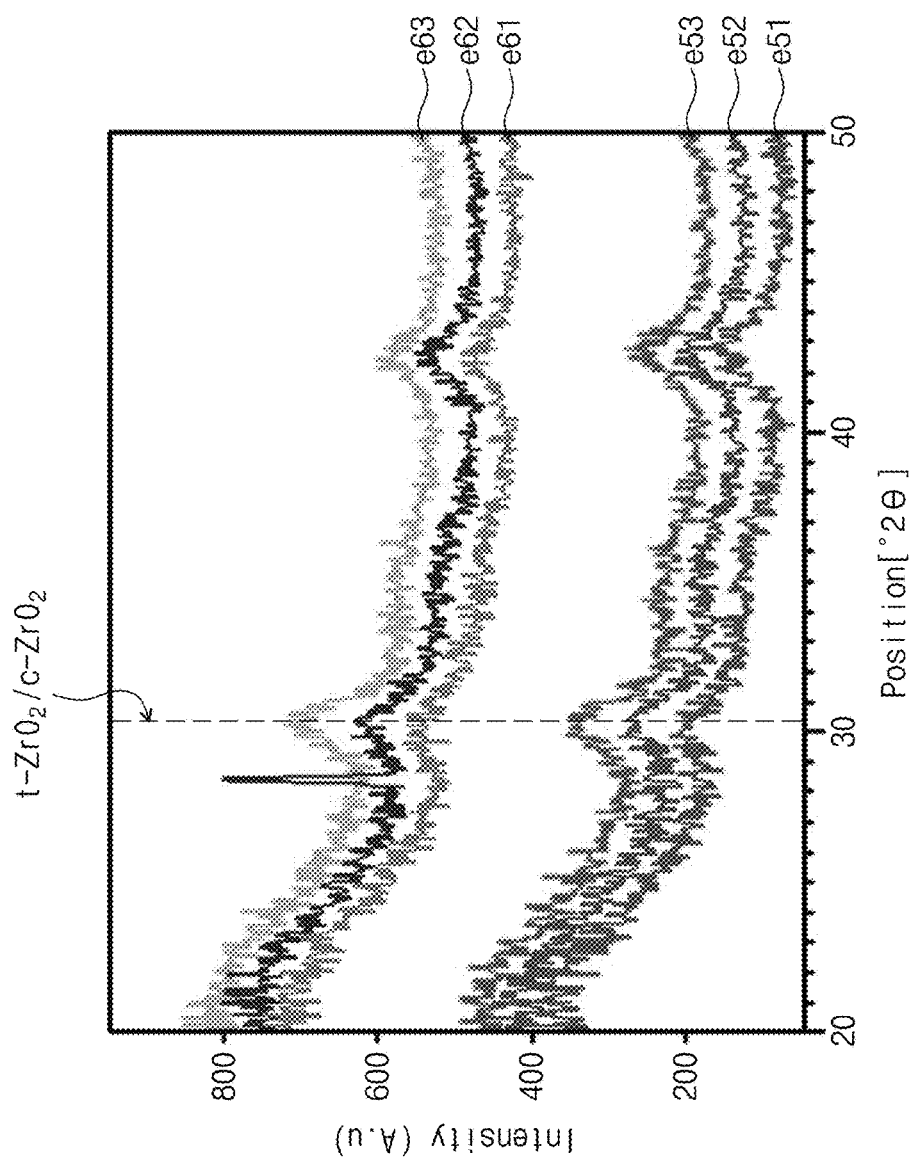
FIG. 11H is a graph illustrating results of X-ray diffraction analysis of crystal structures of zirconium oxide layers which are respectively formed on seed layers at different temperatures from each other.

FIG. 11H is a graph illustrating results of X-ray diffraction analysis of crystal structures of zirconium oxide layers which are respectively formed on seed layers at different temperatures from each other. For example, zirconium oxide layers were formed (deposited) on nickel (Ni) layers at 250° C., 275° C. and 300° C., respectively, and they were analyzed by X-ray diffraction analysis. In samples e51, e52 and e53, the thickness of each of the nickel layers was 40 Å. The samples e51, e52 and e53 show the analysis results of the zirconium oxide layers formed on the nickel layers of 40 Å at 250° C., 275° C. and 300° C., respectively. In samples e61, e62 and e63, the thickness of each of the nickel layers was 20 Å. The samples e61, e62 and e63 show the analysis results of the zirconium oxide layers formed on the nickel layers of 20 Å at 250° C., 275° C. and 300° C., respectively. Here, thicknesses of the zirconium oxide layers of the samples e51, e52, e53, e61, e62 and e63 were 57 Å, 60 Å, 63 Å, 55 Å, 57 Å, and 63 Å, respectively.

Referring to FIG. 11H, the zirconium oxide (t-$ZrO_2$) having the tetragonal crystal structure was formed when the zirconium oxide layers were formed at relatively low temperatures (e.g., 290° C. or less) like the samples e51, e52, e61 and e62. The zirconium oxide (t-$ZrO_2$) having the tetragonal crystal structure was formed when the zirconium oxide layers were formed at relatively high temperatures (e.g., greater than 290° C.) like the samples e53 and e63. Furthermore, the zirconium oxide (t-$ZrO_2$) having the tetragonal crystal structure was formed even though the seed layers (i.e., the nickel layers) were relatively thin as the samples e61, e62 and e63.

Figure 12A:
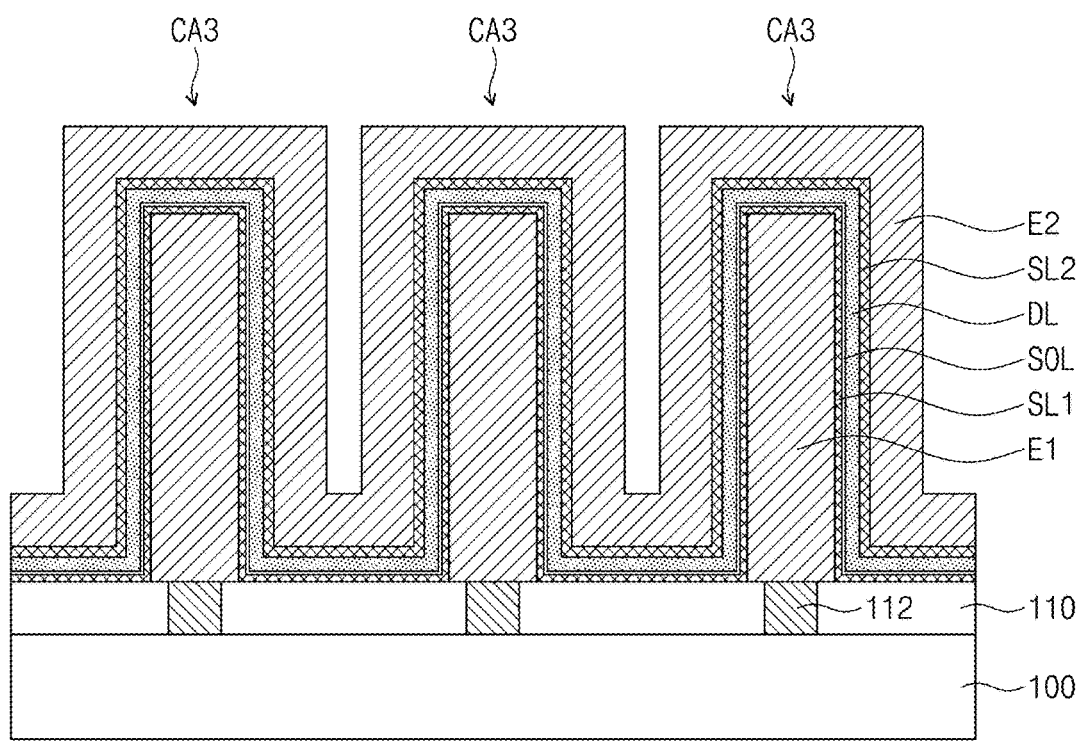
FIGS. 12A to 12C are cross-sectional views illustrating examples of a shape of a capacitor of a semiconductor device according to some embodiments of the inventive concepts.
Figure 12B:
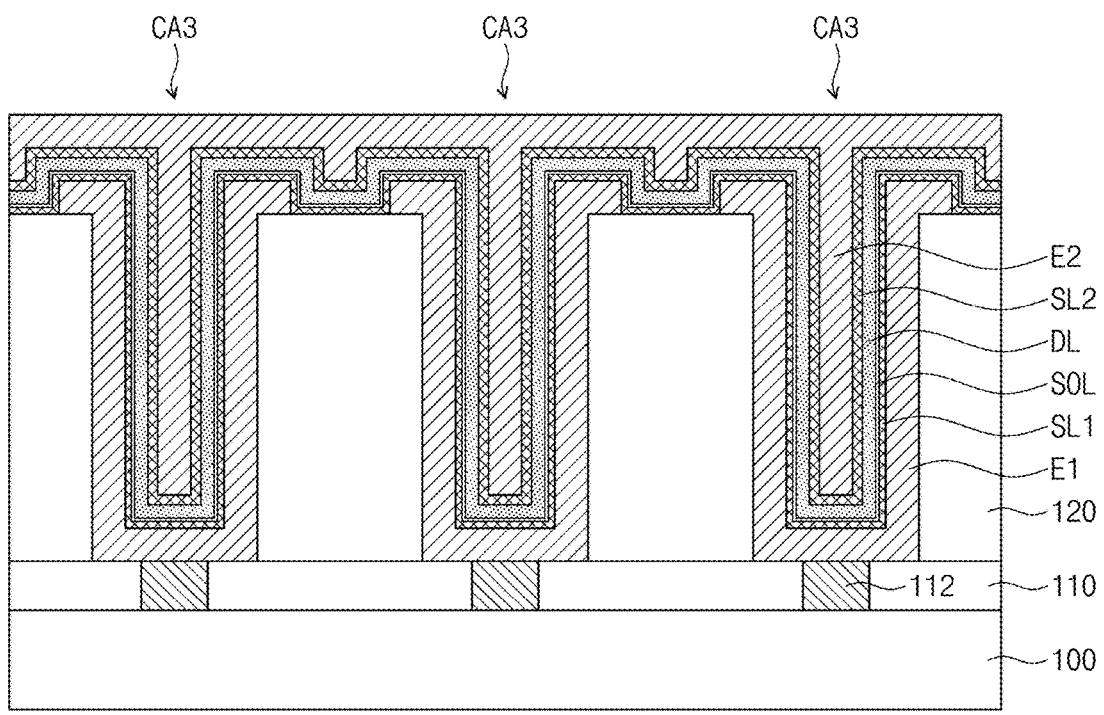
Figure 12C:
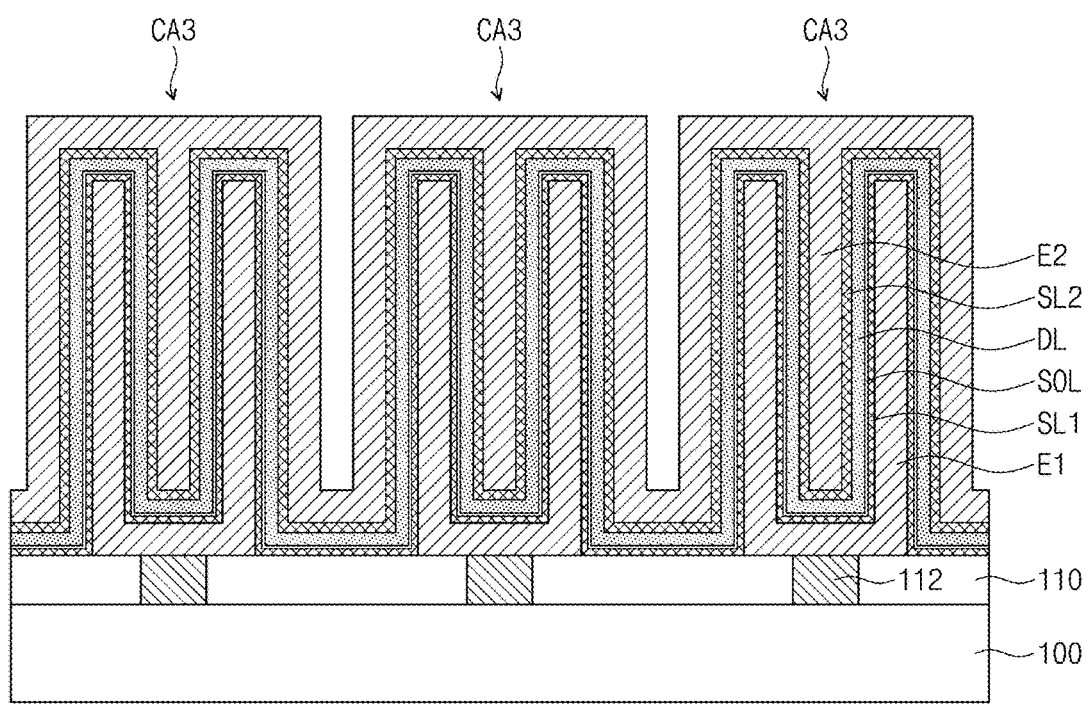

FIGS. 12A to 12C are cross-sectional views illustrating examples of a shape of a capacitor of a semiconductor device according to some embodiments of the inventive concepts. Capacitors may be substantially the same as the ones described with reference to FIG. 1, FIG. 5, and/or FIG. 8, except their shapes.

Referring to FIGS. 12A to 12C, an interlayer insulating layer 110 may be provided on a substrate 100. The interlayer insulating layer 110 may cover selection elements (not shown) provided on the substrate 100.

Contact plugs 112 may be provided in the interlayer insulating layer 110. The contact plugs 112 may be electrically connected to the selection elements, respectively.

Capacitors CA3 may be provided on the interlayer insulating layer 110. The capacitors CA3 may be electrically connected to the contact plugs 112, respectively. The capacitors CA3 described with reference to FIG. 8 are illustrated in FIGS. 12A to 12C. However, embodiments of the inventive concepts are not limited thereto. In certain embodiments, each of the capacitors CA3 may be replaced with the capacitor CA1 described with reference to FIG. 1 or the capacitor CA2 described with reference to FIG. 5. Each of the capacitors CA3 may include the first electrode E1, the second electrode E2, the dielectric layer DL, the first seed layer SL1, the second seed layer SL2, and the sub-oxide layer SOL. The first electrodes E1 may be respectively provided in the capacitors CA3 and may be spaced apart from each other. On the other hand, the second electrode E2, the dielectric layer DL, the first seed layer SL1, the second seed layer SL2, and the sub-oxide layer SOL may be shared by the plural capacitors CA3.

In some embodiments, each of the first electrodes E1 may have a pillar shape, as illustrated in FIG. 12A. The first seed layer SL1, the sub-oxide layer SOL, the dielectric layer DL, the second seed layer SL2, and the second electrode E2 may conformally cover sidewalls and top surfaces of the first electrodes E1 and a top surface of the interlayer insulating layer 110.

In certain embodiments, the first electrodes E1 may be provided in an upper insulating layer 120 formed on the interlayer insulating layer 110, as illustrated in FIG. 12B. Each of the first electrodes E1 may have a hollow cylindrical shape having a closed bottom end, and outer sidewalls of the first electrodes E1 may be in contact with the upper insulating layer 120. The first seed layer SL1, the sub-oxide layer SOL, the dielectric layer DL, the second seed layer SL2, and the second electrode E2 may conformally cover inner surfaces of the first electrodes E1 and a top surface of the upper insulating layer 120.

In certain embodiments, each of the first electrodes E1 may have a hollow cylindrical shape having a closed bottom end, as illustrated in FIG. 12C. The first seed layer SL1, the sub-oxide layer SOL, the dielectric layer DL, the second seed layer SL2, and the second electrode E2 may conformally cover inner surfaces and outer sidewalls of the first electrodes E1 and the top surface of the interlayer insulating layer 110.

Figure 13A:
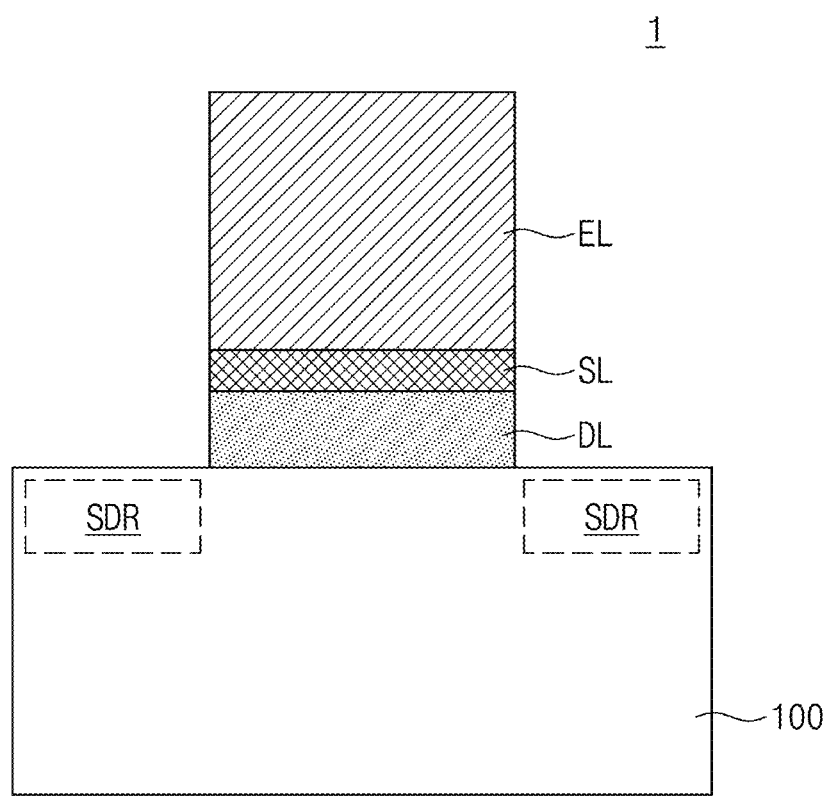
FIG. 13A is a cross-sectional view illustrating a semiconductor device according to some embodiments of the inventive concepts.

FIG. 13A is a cross-sectional view illustrating a semiconductor device according to some embodiments of the inventive concepts. Hereinafter, the descriptions to the same technical features as in the above embodiments will be omitted or mentioned briefly for the purpose of ease and convenience in explanation.

Referring to FIG. 13A, a semiconductor device 1 may include a substrate 100, a dielectric layer DL, a seed layer SL, and a gate electrode layer EL. The substrate 100 may be a semiconductor substrate. For example, the substrate 100 may be a silicon substrate, a germanium substrate, or a silicon-germanium substrate. Alternatively, the substrate 100 may be a silicon-on-insulator (SOI) substrate. The substrate 100 may have source/drain regions SDR and a channel region. The source/drain regions SDR of the substrate 100 may be regions doped with dopants or a dopant. The dielectric layer DL, the seed layer SL and the gate electrode layer EL may expose the source/drain regions SDR of the substrate 100. A portion of the substrate 100, which is provided under the gate electrode layer EL, may function as the channel region. The channel region of the substrate 100 may be provided between the source/drain regions SDR.

The dielectric layer DL may be formed on the substrate 100. The dielectric layer DL may include zirconium oxide and/or hafnium oxide. The dielectric layer DL may have a thickness of about 35 Å to about 85 Å. The dielectric layer DL may be deposited on the substrate 100 in an amorphous state. The dielectric layer DL may be formed by, for example, a CVD process or an ALD process. The dielectric layer DL may function as a gate insulating layer.

The seed layer SL may be formed on the dielectric layer DL. For example, the seed layer SL may be formed by a CVD process or an ALD process. The seed layer SL may include a seed material that assists crystallization of a dielectric material, included in the dielectric layer DL, in a tetragonal crystal structure. The seed material may be substantially the same as the one described with reference to FIG. 1. For example, the seed material may satisfy at least one of the aforementioned lattice constant condition or the aforementioned bond length condition. For example, the seed material may satisfy the aforementioned conductive condition, the aforementioned work function condition, and/ or the aforementioned oxide band gap condition. For example, the seed material may include cobalt, nickel, copper, and $Co_4N$.

The gate electrode layer EL may be formed on the seed layer SL. For example, the gate electrode layer EL may be formed by a CVD process or an ALD process. The gate electrode layer EL may include a conductive material. For example, the gate electrode layer EL may include at least one of a semiconductor material doped with dopants or a dopant, a metal, a conductive metal nitride, and/or a metal-semiconductor compound. The process of forming the gate electrode layer EL may be performed at about 240 degrees Celsius or more, e.g., a temperature of about 240 degrees Celsius to about 400 degrees Celsius. The amorphous dielectric material included in the dielectric layer DL may be affected by the seed layer SL under the temperature condition, and for example, the dielectric layer DL may be crystallized during the process of forming the gate electrode layer EL. Since the seed layer SL is adjacent to the dielectric layer DL, the dielectric material may be crystallized in the tetragonal crystal structure.

Thereafter, a subsequent thermal treatment process may be performed. The crystallization of the dielectric material, included in the dielectric layer DL, in the tetragonal crystal structure may be completed by the subsequent thermal treatment process. The subsequent thermal treatment process may correspond to, for example, a process of forming conductive interconnection lines (not shown) on the gate electrode layer EL and may be performed at about 240 degrees Celsius or more, e.g., a temperature of about 240 degrees Celsius to about 400 degrees Celsius.

Figure 13B:
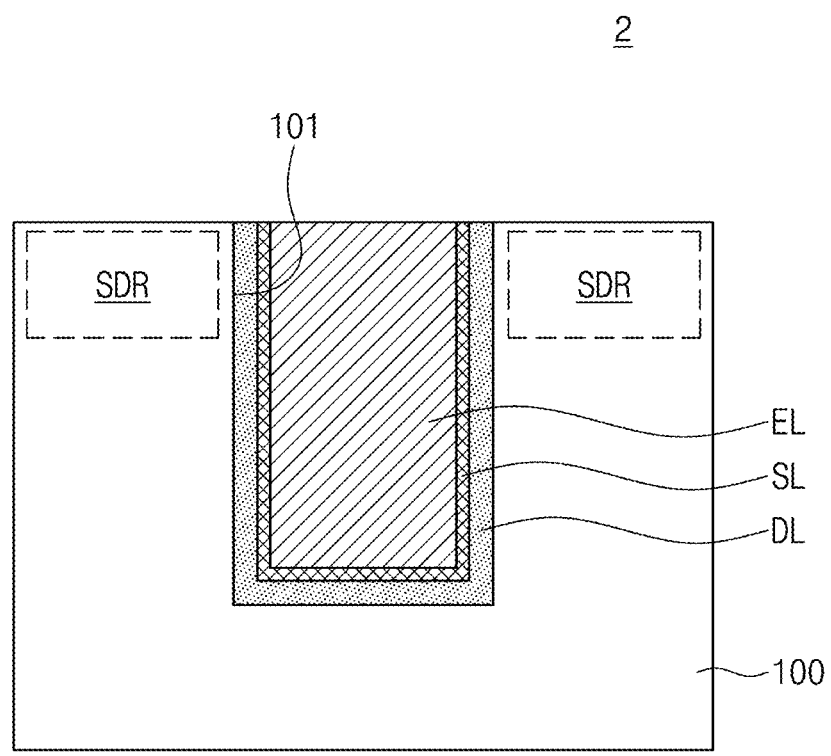
FIG. 13B is a cross-sectional view illustrating a semiconductor device according to some embodiments of the inventive concepts.

FIG. 13B is a cross-sectional view illustrating a semiconductor device according to some embodiments of the inventive concepts. Hereinafter, the descriptions to the same technical features as in the above embodiments will be omitted or mentioned briefly for the purpose of ease and convenience in explanation.

Referring to FIG. 13B, a semiconductor device 2 may include a substrate 100, a dielectric layer DL, a seed layer SL, and a gate electrode layer EL. The dielectric layer DL, the seed layer SL and the gate electrode layer EL of FIG. 13B may be substantially the same as the dielectric layer DL, the seed layer SL and the gate electrode layer EL of FIG. 13A, respectively. However, the gate electrode layer EL of FIG. 13B may be buried in the substrate 100.

According to some embodiments of the inventive concepts, a trench 101 may be formed in the substrate 100. The dielectric layer DL may be conformally formed on an inner surface of the trench 101. The dielectric layer DL may include substantially the same material as the dielectric layer DL described with reference to FIG. 1. The dielectric layer DL may be deposited on the substrate 100 in an amorphous state. For example, at least a portion of the dielectric material included in the dielectric layer DL may be in amorphous state immediately after the dielectric layer DL is deposited on the substrate 100. In certain embodiments, the dielectric material included in the dielectric layer DL may be substantially in amorphous state when the dielectric material is deposited on the substrate 100. The seed layer SL may be formed on the dielectric layer DL. The seed layer SL may include a seed material that assists crystallization of the dielectric material, included in the dielectric layer DL, in a tetragonal crystal structure. The seed material may be substantially the same as the seed material described with reference to FIG. 1. The gate electrode layer EL may be formed on the seed layer SL to fill the trench 101. The process of forming the gate electrode layer EL may be performed at about 240 degrees Celsius or more, e.g., a temperature of about 240 degrees Celsius to about 400 degrees Celsius. For example, the dielectric layer DL may be crystallized in the tetragonal crystal structure during the process of forming the gate electrode layer EL. Source/drain regions SDR may be provided in the substrate 100 at both sides of the gate electrode layer EL.

Thereafter, a subsequent thermal treatment process may be performed. The crystallization of the dielectric material, included in the dielectric layer DL, in the tetragonal crystal structure may be completed by the subsequent thermal treatment process. The subsequent thermal treatment process may correspond to, for example, a process of forming conductive interconnection lines (not shown) on the gate electrode layer EL and may be performed at about 240 degrees Celsius or more, e.g., a temperature of about 240 degrees Celsius to about 400 degrees Celsius. The subsequent thermal treatment process may be a process forming a conductive interconnection line electrically connected to the gate electrode layer EL, or may be a process other than forming a conductive interconnection line. A temperature between 240 degrees Celsius and 400 degrees Celsius may be applied in a subsequent thermal treatment process thereby inducing a tetragonal crystal structure in the dielectric layer DL.

According to some embodiments of the inventive concepts, the dielectric layer may include the hafnium oxide of the tetragonal crystal structure or the zirconium oxide of the tetragonal crystal structure, which has a high dielectric constant. Thus, the capacitance of the capacitor may be improved.

According to some embodiments of the inventive concepts, the dielectric material may be crystallized in the tetragonal crystal structure without an additional high-temperature thermal treatment process. Thus, the processes for manufacturing the capacitor may be simplified.

According to some embodiments of the inventive concepts, the dielectric material may be crystallized in the tetragonal crystal structure under a low temperature condition. Thus, the processes for manufacturing the capacitor may be simplified, and a leakage current flowing through the dielectric layer may be reduced or prevented.

According to some embodiments of the inventive concepts, the dielectric layer may have a relatively thin thickness, and the size of the capacitor may be reduced or minimized while maintaining proper capacitance for the capacitor and/or the semiconductor device to work properly.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative.

What is claimed is:
1. A capacitor comprising:
a first electrode and a second electrode spaced apart from each other;
a dielectric layer disposed between the first electrode and the second electrode; and
a first seed layer disposed between the first electrode and the dielectric layer,
wherein the dielectric layer includes a dielectric material having a tetragonal crystal structure,
wherein the first seed layer includes a first seed material, and wherein a lattice constant of the first seed material has a lattice mismatch of 2% or less with a horizontal lattice constant of the dielectric material.

2. The capacitor of claim 1, wherein the first seed material comprises a conductor.

3. The capacitor of claim 1, wherein a band gap of an oxide of the first seed material is 3 eV or less.

4. The capacitor of claim 1, wherein a work function of the first seed material is 4.7 eV or more.

5. The capacitor of claim 1, wherein the first seed material has a cubic crystal structure.

6. The capacitor of claim 1, wherein the first seed material includes cobalt, nickel, copper, or $Co_xN$ (where $3.5<x<4.5$).

7. The capacitor of claim 1, wherein the dielectric layer includes hafnium oxide having the tetragonal crystal structure or zirconium oxide having the tetragonal crystal structure.

8. The capacitor of claim 1, further comprising:
a second seed layer disposed between the second electrode and the dielectric layer,
wherein the second seed layer includes a second seed material, and
wherein a lattice constant of the second seed material has a lattice mismatch of 2% or less with the horizontal lattice constant of the dielectric material.

9. The capacitor of claim 1, further comprising:
a sub-oxide layer disposed between the dielectric layer and the first seed layer,
wherein the sub-oxide layer includes the same metal as a metal included in the first seed layer.

10. The capacitor of claim 9, wherein a thickness of the sub-oxide layer is in a range from 5 Å to 10 Å.

11. A capacitor comprising:
a first electrode and a second electrode spaced apart from each other;
a dielectric layer disposed between the first electrode and the second electrode; and
a metal seed layer disposed between the first electrode and the dielectric layer,
wherein the dielectric layer includes a dielectric material having a tetragonal crystal structure,
wherein the metal seed layer includes a seed material, and
wherein a mismatch between a bond length between metal atoms of the seed material and a bond length between oxygen atoms of the dielectric material is 5% or less.

12. The capacitor of claim 11, wherein a band gap of an oxide of the seed material is 3 eV or less.

13. The capacitor of claim 11, wherein a work function of the seed material is 4.7 eV or more.

14. The capacitor of claim 11, wherein the seed material has a cubic crystal structure.

15. The capacitor of claim 11, wherein the seed material includes cobalt, nickel, or copper.

16. The capacitor of claim 11, wherein the dielectric layer includes hafnium oxide having the tetragonal crystal structure or zirconium oxide having the tetragonal crystal structure.

17. A capacitor comprising:
a first electrode and a second electrode spaced apart from each other;
a dielectric layer disposed between the first electrode and the second electrode; and
a seed layer disposed between the first electrode and the dielectric layer, the seed layer including a seed material,
wherein the dielectric layer includes hafnium oxide having a tetragonal crystal structure or zirconium oxide having a tetragonal crystal structure, and
wherein a mismatch between a bond length between atoms of the seed material and a bond length between oxygen atoms of the dielectric layer is 5% or less.

18. The capacitor of claim 17, wherein the seed layer includes a cobalt layer, a nickel layer, a copper layer, or a $Co_xN$ layer (where $3.5<x<4.5$).

19. The capacitor of claim 18, further comprising:
a sub-oxide layer disposed between the dielectric layer and the seed layer,
wherein the sub-oxide layer includes the same metal as a metal included in the seed layer.

20. The capacitor of claim 19, wherein a thickness of the sub-oxide layer ranges from 5 Å to 10 Å.

21. The capacitor of claim 19, wherein the metal included in the sub-oxide layer is different from the metal included in the dielectric layer.

* * * * *